(12) United States Patent
Müller et al.

(10) Patent No.: US 10,262,993 B2
(45) Date of Patent: Apr. 16, 2019

(54) SEMICONDUCTOR DEVICES AND A METHOD FOR FORMING A SEMICONDUCTOR DEVICE

(71) Applicant: Infineon Technologies AG, Neubiberg (DE)

(72) Inventors: Marten Müller, Rostock (DE); Hans-Günter Eckel, Rostock (DE)

(73) Assignee: Infineon Technologies AG, Neubiberg (DE)

( * ) Notice: Subject to any disclaimer, the term of this patent is extended or adjusted under 35 U.S.C. 154(b) by 80 days.

(21) Appl. No.: 15/043,476

(22) Filed: Feb. 12, 2016

(65) Prior Publication Data
US 2016/0240644 A1 Aug. 18, 2016

(30) Foreign Application Priority Data
Feb. 13, 2015 (DE) .................. 10 2015 102 138

(51) Int. Cl.
*H01L 27/07* (2006.01)
*H01L 29/861* (2006.01)

(52) U.S. Cl.
CPC ...... *H01L 27/0727* (2013.01); *H01L 29/8611* (2013.01); *H01L 29/8613* (2013.01)

(58) Field of Classification Search
CPC ................................................ H01L 27/0727
See application file for complete search history.

(56) References Cited

U.S. PATENT DOCUMENTS

| | | | |
|---|---|---|---|
| 2003/0178672 A1* | 9/2003 | Hatakeyama | H01L 29/0615 257/328 |
| 2008/0012050 A1* | 1/2008 | Aoki | H01L 29/0696 257/262 |
| 2008/0237656 A1 | 10/2008 | Williams | |
| 2008/0246055 A1* | 10/2008 | Schulze | H01L 29/16 257/133 |
| 2009/0014719 A1* | 1/2009 | Shimizu | H01L 27/0605 257/49 |
| 2009/0230500 A1* | 9/2009 | Yoshikawa | H01L 27/0255 257/470 |

(Continued)

OTHER PUBLICATIONS

Office Action communication of the German Patent and Trademark Office for Appln. Ser. No. 102015102138.2, dated Mar. 24, 2016.

*Primary Examiner* — Eugene Lee
(74) *Attorney, Agent, or Firm* — Slater Matsil, LLP

(57) ABSTRACT

A semiconductor device includes a first transistor structure including a first transistor body region of a first conductivity type located within a semiconductor substrate. At least part of the first transistor body region is located between a first source/drain region of the first transistor structure and a second source/drain region of the first transistor structure. The semiconductor device includes a second transistor structure including a second transistor body region of a second conductivity type located within the semiconductor substrate. At least part of the second transistor body region is located between a first source/drain region of the second transistor structure and a second source/drain region of the second transistor structure. At least part of the second source/drain region of the second transistor structure is located between a doping region comprising the second source/drain region of the first transistor structure and the second transistor body region.

13 Claims, 23 Drawing Sheets

(56) References Cited

U.S. PATENT DOCUMENTS

2012/0181575 A1* 7/2012 Pfirsch ............... H01L 29/0834
257/139
2014/0048843 A1* 2/2014 Chen .................... H01L 29/749
257/133

* cited by examiner

SEMICONDUCTOR DEVICES AND A METHOD FOR FORMING A SEMICONDUCTOR DEVICE

CROSS-REFERENCE TO RELATED APPLICATION

This application claims priority to German Application Serial No. 102015102138.2 filed Feb. 13, 2015 and entitled "Semiconductor Devices and a Method for Forming a Semiconductor Device".

TECHNICAL FIELD

Embodiments relate to semiconductor structures and in particular to semiconductor devices and a method for forming a semiconductor device.

BACKGROUND

In driver and energy technology, voltage source converters may use switchable transistors, thyristors, insulated gate bipolar transistors (IGBT) and free-wheeling diodes as power semiconductors. Diodes may be optimized for small forward voltages. However, they may have a high reverse recovery charge. This may lead to high turn-on losses of an IGBT and high reverse recovery losses of a diode during switching operations, for example.

SUMMARY

Some embodiments relate to a semiconductor device. The semiconductor device includes a first transistor structure including a first transistor body region of a first conductivity type located within a semiconductor substrate. At least part of the first transistor body region is located between a first source/drain region of the first transistor structure and a second source/drain region of the first transistor structure. The semiconductor device includes a second transistor structure including a second transistor body region of a second conductivity type located within the semiconductor substrate. At least part of the second transistor body region is located between a first source/drain region of the second transistor structure and a second source/drain region of the second transistor structure. At least part of the second source/drain region of the second transistor structure is located between a doping region comprising the second source/drain region of the first transistor structure and the second transistor body region. The semiconductor device includes a first electrode structure in electrical connection with the first source/drain region of the first transistor structure and the first source/drain region of the second transistor structure. The semiconductor device includes a second electrode region in electrical connection with the second source/drain region of the first transistor structure.

Some embodiments relate to a further semiconductor device. The semiconductor device includes a first doping region of a first conductivity type formed in a fourth doping region of a semiconductor substrate. The first doping region forms a first transistor body region of a first transistor structure and a second source/drain region of a second transistor structure. The fourth doping region forms a second source/drain region of the first transistor structure. The semiconductor device includes a second doping region of a second conductivity type formed in the first doping region. The second doping region forms a first source/drain region of the first transistor structure and a second transistor body region of the second transistor structure. The semiconductor device includes a third doping region of a first conductivity type formed in the second doping region. The third doping region forms a first source/drain region of the second transistor structure. The semiconductor device includes a first electrode structure in electrical connection with the second doping region and the third doping region. The semiconductor device includes a second electrode region in electrical connection with the fourth doping region.

Some embodiments relate to a method for forming a semiconductor device. The method includes forming a first doping region of a first conductivity type in a semiconductor substrate to form a first transistor body region of a first transistor structure and a second source/drain region of a second transistor structure. The method further includes forming a second doping region of a second conductivity type in the first doping region to form a first source/drain region of the first transistor structure and a second transistor body region of the second transistor structure. The method further includes forming a third doping region of a first conductivity type in the second doping region to form a first source/drain region of the second transistor structure.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1A:
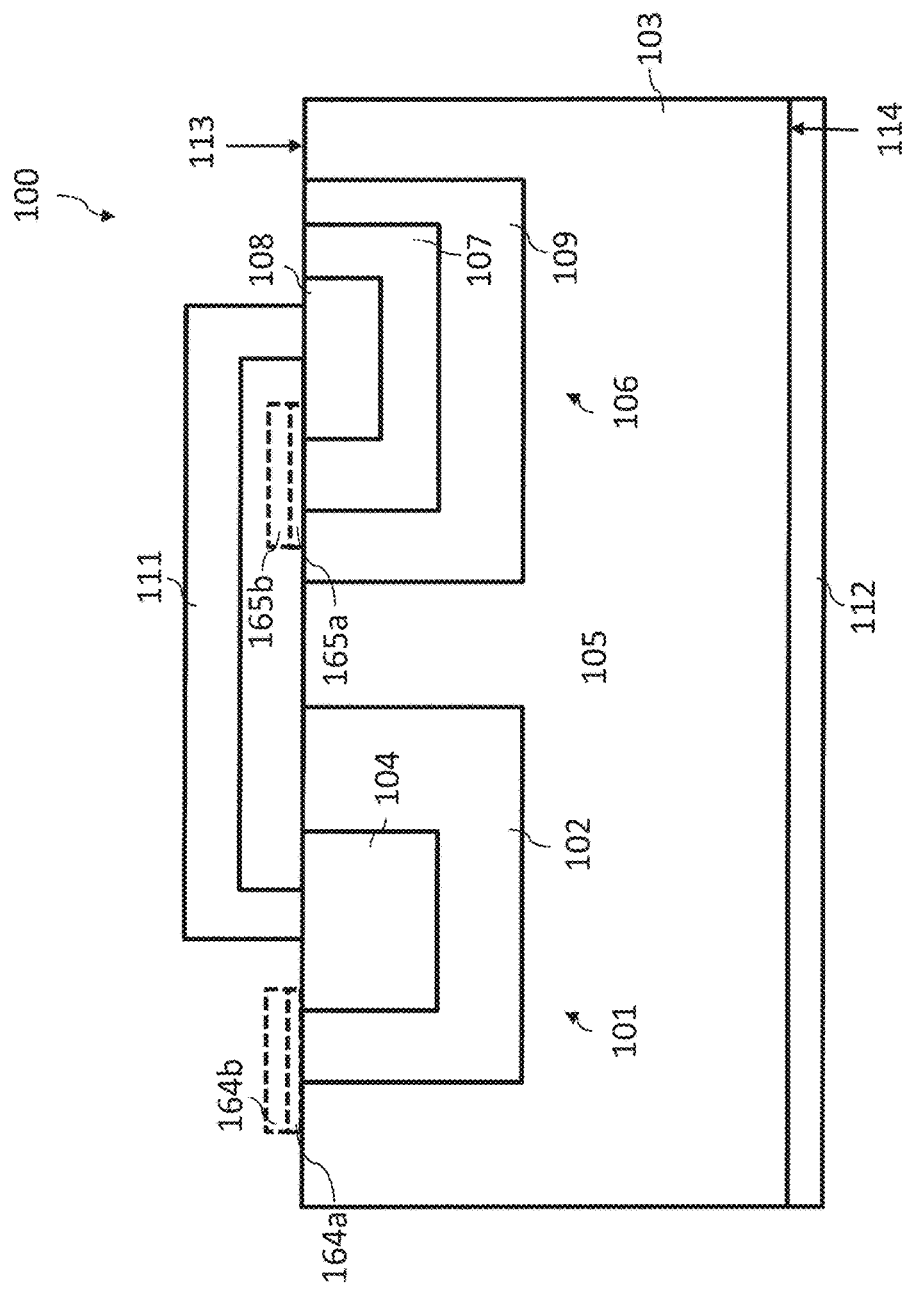
FIG. 1A shows a semiconductor device according to an embodiment.

FIG. 1A shows a semiconductor device 100 according to an embodiment.

The semiconductor device 100 includes a first transistor structure 101 including a first transistor body region 102 of a first conductivity type located within a semiconductor substrate 103. At least part of the first transistor body region 102 is located between a first source/drain region 104 of the first transistor structure and a second source/drain region 105 of the first transistor structure. The first source/drain region 104 of the first transistor structure is of the second conductivity type.

The semiconductor device 100 includes a second transistor structure 106 including a second transistor body region 107 of a second conductivity type located within the semiconductor substrate 103. At least part of the second transistor body region 107 is located between a first source/drain region 108 of the second transistor structure and a second source/drain region 109 of the second transistor structure. At least part of the second source/drain region 109 of the second transistor structure is located between a doping region comprising the second source/drain region 105 of the first transistor structure and the second transistor body region 107.

The semiconductor device 100 includes a gate 164b of the first transistor structure. A transistor channel of the first transistor structure controllable by the gate 164b of the first transistor structure is limited to a channel region located between the first source/drain region 104 of the first transistor structure and the second source/drain region 105 of the first transistor structure.

The semiconductor device 100 includes a first electrode structure 111 in electrical connection with the first source/drain region 104 of the first transistor structure and the first source/drain region 108 of the second transistor structure.

The semiconductor device includes a second electrode region 112 in electrical connection with the second source/drain region 105 of the first transistor structure.

Due to the implementation of the first transistor body region of the first transistor structure being of a first conductivity type and a second transistor body region of the second transistor structure being of the second conductivity type, a semiconductor device with improved switching speed and/or higher latch-up strength may be achieved. For example, the first transistor structure and second transistor structure may be used to tune or to vary a charge carrier concentration in the semiconductor device, e.g. in a drift region of the semiconductor device. Therefore, switching speeds (turn-on and turn off) may be selectively tuned or varied if necessary, for example.

The first transistor structure 101 may include one or more doping regions formed in the semiconductor substrate 103. For example, the first transistor structure 101 may include or be a field effect transistor structure (e.g. a MOSFET) having a source doping region, a drain doping region, and channel region, for example. The first transistor structure 101 includes a first transistor body region 102 of a first conductivity type (e.g. p-type) located within the semiconductor substrate 103. The first transistor structure 101 further includes a first source/drain region 104 of the second conductivity type (e.g. n-type) and a second source/drain region 105 of the second conductivity type (e.g. n-type), for example.

The first transistor structure 101 may be a vertical transistor structure. For example, the first electrode structure and the second electrode structure may be arranged at opposite surfaces of the semiconductor substrate.

The first source/drain region 104 of the first transistor structure may be a highly doped region of the second conductivity type (e.g. an n+ region), and may be formed adjacent (e.g. directly adjacent) to the first transistor body region 102. For example, the first source/drain region 104 of the first transistor structure may be formed at the front side or at the front surface 113 of the semiconductor substrate 103. The first source/drain region 104 of the first transistor structure may have a dopant concentration (e.g. averaged over the doping region) which lies between $1\times10^{18}$ to $1\times10^{20}$ cm$^{-3}$, or e.g. between $1\times10^{17}$ to $1\times10^{19}$ cm$^{-3}$, or e.g. between $5\times10^{17}$ to $5\times10^{18}$ cm$^{-3}$, for example.

A doping region including (e.g. comprising) the first transistor body region 102 may be formed around or at least partially surround a doping region including (e.g. comprising) first source/drain region 104 of the first transistor structure, for example. The first transistor body region 102 may have a doping of the first conductivity type (e.g. p-type). The first transistor body region 102 may have a dopant concentration which lies between $1\times10^{15}$ cm$^{-3}$ and $2\times10^{17}$ cm$^{-3}$, or e.g. between $5\times10^{15}$ cm$^{-3}$ and $5\times10^{16}$ cm$^{-3}$, or between $5\times10^{15}$ cm$^{-3}$ and $1\times10^{16}$ cm$^{-3}$, for example. The doping concentration of the first transistor body region 102 may be lower than the doping concentration of the first source/drain region 104, for example.

The second source/drain region 105 of the first transistor structure may be formed adjacent (e.g. directly adjacent) to the first transistor body region 102. For example, the first transistor body region 102 may be formed or located between the second source/drain region 105 of the first transistor structure and the first source/drain region 102 of the first transistor structure. The second source/drain region 105 of the first transistor structure may have a doping of the second conductivity type (e.g. an n type doping region).

The second source/drain region 105 may include a drift region of the second conductivity type (e.g. a lightly doped n− region) and an emitter (e.g. a cathode) region of the second conductivity type (e.g. a highly doped n+ region).

The second source/drain region 105 (e.g. the drift region of the second source/drain region 105) may be formed between the first transistor body region and the emitter region, for example. The drift region may be a bulk region of the semiconductor substrate 103. For example, the drift region may be a part of the bulk semiconductor substrate being a lightly doped region of the second conductivity type (e.g. a lightly doped n− region). The lightly doped drift region (or the bulk semiconductor substrate) may have a dopant concentration smaller than a dopant concentration of the (highly doped) emitter region and smaller than a dopant concentration of the first transistor body region, for example. The (lightly doped) drift region of the second source/drain region 105 may have a dopant concentration (e.g. averaged over the doping region) which lies between $5\times10^{12}$ to $2\times10^{14}$ cm$^{-3}$, or e.g. between $5\times10^{12}$ to $5\times10^{13}$ cm$^{-3}$, or e.g. between $1\times10^{13}$ to $5\times10^{13}$ cm$^{-3}$, for example. The drift region of the second source/drain region 105 may be formed or located (directly) adjacent to the first transistor body region 102, for example. The drift region may be formed around or at least partially surround the first transistor body region 102, for example.

The (highly doped) emitter region may be formed or located (directly) adjacent to the (lightly doped) drift region. For example, the emitter region may be formed (e.g. by implantation) in the semiconductor substrate 103 at a back side 114 of the semiconductor substrate. The (highly doped) emitter region may have a dopant concentration which lies between $1\times10^{18}$ to $1\times10^{20}$ cm$^{-3}$, or e.g. between $1\times10^{17}$ to $1\times10^{19}$ cm$^{-3}$, or e.g. between $5\times10^{17}$ to $5\times10^{18}$ cm$^{-3}$, for example.

The second (MOSFET) transistor structure 106 may be a vertical transistor structure or a lateral transistor structure. For example, the first source/drain region 108 of the second transistor structure, the second transistor body region 107 and the second source/drain region 109 of the second transistor structure may be formed or arranged vertically with respect to each other in the semiconductor substrate 103, for example. The second transistor structure 106 may include a second transistor body region 107 of the second conductivity type (e.g. n-type) located within the semiconductor substrate 103. The second transistor structure 106 may further include a first source/drain region 108 of the first conductivity type (e.g. p-type) and a second source/drain region 109 of the first conductivity type (e.g. p-type).

The first source/drain region 108 of the second transistor structure may be a highly doped region of the first conductivity type (e.g. a p+ region), and may be formed adjacent (e.g. directly adjacent) to the second transistor body region 107. For example, the first source/drain region 108 of the second transistor structure may be formed above the second transistor body region 107 in the semiconductor substrate 103. For example, the first source/drain region 108 of the second transistor structure may be formed at the front side or at the front surface 113 of the semiconductor substrate 103. The first source/drain region 108 of the second transistor structure may have a dopant concentration which lies between $1\times10^{18}$ to $1\times10^{20}$ cm$^{-3}$, or e.g. between $1\times10^{17}$ to $1\times10^{19}$ cm$^{-3}$, or e.g. between $5\times10^{17}$ to $5\times10^{18}$ cm$^{-3}$, for example.

The second transistor body region 107 may be formed around the first source/drain region 108 of the second transistor structure, for example. The second transistor body region 102 may have a doping of a second conductivity type, and may have a dopant concentration which lies between $1\times10^{15}$ cm$^{-3}$ and $2\times10^{17}$ cm$^{-3}$, or e.g. between $5\times10^{15}$ cm$^{-3}$ and $5\times10^{16}$ cm$^{-3}$, or between $5\times10^{15}$ cm$^{-3}$ and $1\times10^{16}$ cm$^{-3}$, for example.

The second source/drain region 109 of the second transistor structure may be formed adjacent (e.g. directly adjacent) to the second transistor body region 102. For example, the second source/drain region 109 of the second transistor structure may be formed on an opposite side of the second transistor body region 107 to the first source/drain region 108 of the second transistor structure.

The second source/drain region 109 may be a highly doped region of the first conductivity type (e.g. a highly doped p+ region). For example, the (highly doped) second source/drain region 109 may have a dopant concentration (e.g. averaged over the doping region) which lies between $1\times10^{18}$ to $1\times10^{20}$ cm$^{-3}$, or e.g. between $1\times10^{17}$ to $1\times10^{19}$ cm$^{-3}$, or e.g. between $5\times10^{17}$ to $5\times10^{18}$ cm$^{-3}$, for example.

The second source/drain region 109 may instead be a moderately doped region of the first conductivity type (e.g. a moderately doped p region). The second source/drain region 109 may have a dopant concentration which lies between $1\times10^{15}$ cm$^{-3}$ and $2\times10^{17}$ cm$^{-3}$, or e.g. between $5\times10^{15}$ cm$^{-3}$ and $5\times10^{16}$ cm$^{-3}$, or between $5\times10^{15}$ cm$^{-3}$ and $1\times10^{16}$ cm$^{-3}$, for example. The doping of the second source/drain region 109 may correspond to the doping of the first transistor body region 102.

The semiconductor substrate 103 may be a part of a semiconductor chip or semiconductor wafer, for example. The semiconductor substrate 103 may be a silicon-based semiconductor substrate, a silicon carbide-based semiconductor substrate, a gallium arsenide-based semiconductor substrate or gallium nitride-based semiconductor substrate, for example.

In some examples, the semiconductor substrate 103 may be an intrinsically doped semiconductor (Si) wafer, e.g. an average number of charge carriers of a first charge carrier type (holes) may be equal to an average number of charge carriers of a second charge carrier type (electrons). In other examples, the semiconductor substrate may have a doping of a first conductivity type (e.g. p− type) where a majority of charge carriers are of a first charge carrier type (holes), or may have a doping of a second conductivity type (e.g. n-type) where a majority of charge carriers are of a second charge carrier type (electrons).

The semiconductor substrate 103 may include a semiconductor substrate front main side 113 (or surface) and a semiconductor substrate back main side (or surface) 114. The main surface of the semiconductor substrate may be a substantially even plane (e.g. neglecting unevenness of the semiconductor structure due to the manufacturing process and trenches). For example, a lateral (or horizontal) dimension of the main surface of the substrate may be more than 100 times larger (or more than 1000 times or more than 10000 times) than a maximal height of structures on the main surface. The main surface may be perpendicular to thickness of the semiconductor substrate in the vertical direction.

The first electrode structure 111 (e.g. an anode metallization) may contact the first source/drain region 104 of the first transistor structure and the first source/drain region 108 of the second transistor structure, for example. The first electrode structure 111 may include one or more metal layers formed over the first source/drain region 104 of the first transistor structure and the first source/drain region 108 of the second transistor structure. For example, the first electrode structure 111 may be formed on (e.g. directly on) the front side or surface 113 of the semiconductor substrate 103.

The first electrode structure 111 may be structured (e.g. using semiconductor fabrication process such as photolithography and/or etching) to include one or more partial structures of the first electrode structure 111 for contacting the semiconductor doping regions which may be spaced apart laterally. The one or more partial structures of the first electrode structure 111 may be electrically connected (or commonly joined) by the first electrode material so that the same voltage or current may be delivered or drawn from the partial structures of the first electrode structure 111. In other words, the one or more partial structures may deliver the same voltage or current to the first transistor structure 101 and the second transistor structure 106, for example.

The second electrode region 112 (e.g. a cathode metallization) may be a back side metallization layer which may be formed on (e.g. directly on) a back side or surface 114 of the semiconductor substrate 103.

The second electrode region 112 and the first electrode structure 111 may be formed from or may each include one or more electrically conductive (e.g. metal) layers formed on and/or structured over a side of the semiconductor substrate 103. Examples of possible materials of the first electrode structure 111 and the second electrode structure 112 include copper Cu or aluminum Al, or any other appropriate electrically conductive materials, for example.

The gate 164b of the first transistor structure may cover the first transistor body region 102 at the front surface 113 of the semiconductor substrate, and/or partially or fully cover the first source/drain region 104 of the first transistor structure at the front surface 113 of the semiconductor substrate and/or partially or fully cover the second source/drain region 105 of the first transistor structure at the front surface 113 of the semiconductor substrate. For example, a first edge of the gate 164b of the first transistor structure may be located over or on (e.g. formed on) the first source/drain region 104 of the first transistor structure and a second edge of the gate of the first transistor structure may be located on the second source/drain region 105 of the first transistor structure, for example. In other words, the first edge of the gate 164b of the first transistor structure may terminate over or on the first source/drain region 104 of the first transistor structure and the second edge of the gate of the first transistor structure may terminate over or on the second source/drain region 105 of the first transistor structure, for example.

The semiconductor device 100 may further include a first gate insulation layer 164a (e.g. a gate dielectric layer or gate oxide layer) formed between the front surface 113 of the semiconductor substrate 103 and the gate 164b of the first transistor structure. The first gate insulation layer 164a may be formed directly on or adjacent to the front surface 113 of the semiconductor substrate 103 and may insulate the gate of the first transistor structure from the semiconductor substrate 103, for example. For example, a first edge of the first gate insulation layer 164a may be located (directly) on (e.g. may terminate on) the first source/drain region 104 of the first transistor structure and a second edge of the gate of the first transistor structure may be located on (e.g. may terminate on) the second source/drain region 105 of the first transistor structure, for example. For example, the first gate insulation layer 164a does not extend to cover any other doping regions in the semiconductor substrate besides covering the first transistor body region 102 at the front surface 113 of the semiconductor substrate, and/or besides partially or fully covering the first source/drain region 104 of the first transistor structure at the front surface 113 of the semiconductor substrate and/or besides partially or fully covering the second source/drain region 105 of the first transistor structure at the front surface 113 of the semiconductor substrate.

The semiconductor device 100 may further include a gate 165b of the second transistor structure. A transistor channel of the second transistor structure controllable by the gate 165b of the second transistor structure may be limited to a channel region located between the first source/drain region 108 of the second transistor structure and the second source/drain region 109 of the second transistor structure.

The gate 165b of the second transistor structure may cover the second transistor body region 107 at the front surface 113 of the semiconductor substrate, and/or partially or fully cover the first source/drain region 108 of the second transistor structure at the front surface 113 of the semiconductor substrate and/or partially or fully cover the second source/drain region 109 of the second transistor structure at the front surface 113 of the semiconductor substrate. For example, a first edge of the gate 165b of the second transistor structure may be located over or on (e.g. terminate on) the first source/drain region 108 of the second transistor structure and a second edge of the gate 165b of the second transistor structure may be located on (e.g. terminate on) the second source/drain region 109 of the second transistor structure, for example.

The semiconductor device 100 may further include a second gate insulation layer 165a formed between the front surface 113 of the semiconductor substrate 103 and the gate 165b of the second transistor structure. The second gate insulation layer 165a may be formed directly on or adjacent to the front surface 113 of the semiconductor substrate 103, for example. For example, a first edge of the second gate insulation layer 165a may be located (directly) on (e.g. terminate on) the first source/drain region 108 of the second transistor structure and a second edge of the second gate insulation layer 165a of the second transistor structure may be located on (e.g. terminate on) the second source/drain region 109 of the second transistor structure, for example. For example, the second gate insulation layer 165a does not extend to cover any other doping regions in the semiconductor substrate besides covering the second transistor body region 107 at the front surface 113 of the semiconductor substrate, and/or partially or fully covering the first source/drain region 108 of the second transistor structure at the front surface 113 of the semiconductor substrate and/or partially or fully covering the second source/drain region 109 of the second transistor structure at the front surface 113 of the semiconductor substrate.

The transistor channel of the first transistor structure controllable (or induced) by the gate 164b of the first transistor structure may be a (surface) channel of charge carriers of the second conductivity type (e.g. n-type), for example. The transistor channel of the second transistor structure controllable by the gate 165b of the second transistor structure may be a (surface) channel of charge carriers of the first conductivity type (e.g. p-type), for example. In other words, the transistor channel of the first transistor structure and the transistor channel of the second transistor structure may have charge carriers of different or opposite conductivity types.

The first gate insulation layer 164a and the second gate insulation layer 165a may each include a silicon dioxide layer or a high-k dielectric material (having a dielectric constant greater than silicon dioxide, e.g. k>3.9), for example. In general, the gate insulation layer may insulate the (electrically conductive) gate from the semiconductor substrate, for example.

The gate 164b of the first transistor structure may be part of a larger or extended first gate structure and the gate 165b of the second transistor structure may be part of a larger or extended second gate structure. Additionally or optionally, the first gate structure and the second gate structure may be connected to a common gate terminal. Additionally or optionally, the first gate structure and the second gate structure may be part of a single common electrically conductive structure, for example. For example, the single common electrically conductive structure may be formed around the first electrode structure 111 and electrically insulated from the first electrode structure 111 by electrically insulating material. The gate 164b of the first transistor structure and the gate 165b of the second transistor structure may be formed by an electrode, (e.g. a metal electrode) or an electrode stack of one or more electrically conductive layers). The gate 164b of the first transistor structure, the gate 165b of the second transistor structure, the first gate structure and the second gate structure may include heavily doped polycrystalline silicon or copper (Cu) or aluminum (Al), or any other appropriate electrically conductive materials (e.g. metals), for example.

The semiconductor device 100 may be implemented as a switchable transistor structure (as described in FIG. 1B) which may be used to tune or to vary a charge carrier concentration in the semiconductor device. The switchable transistor structure may be used to vary the charge carrier concentration or switching speed in a diode, for example. The semiconductor device 100 may include an anode with higher or improved efficiency, for example.

Figure 1B:
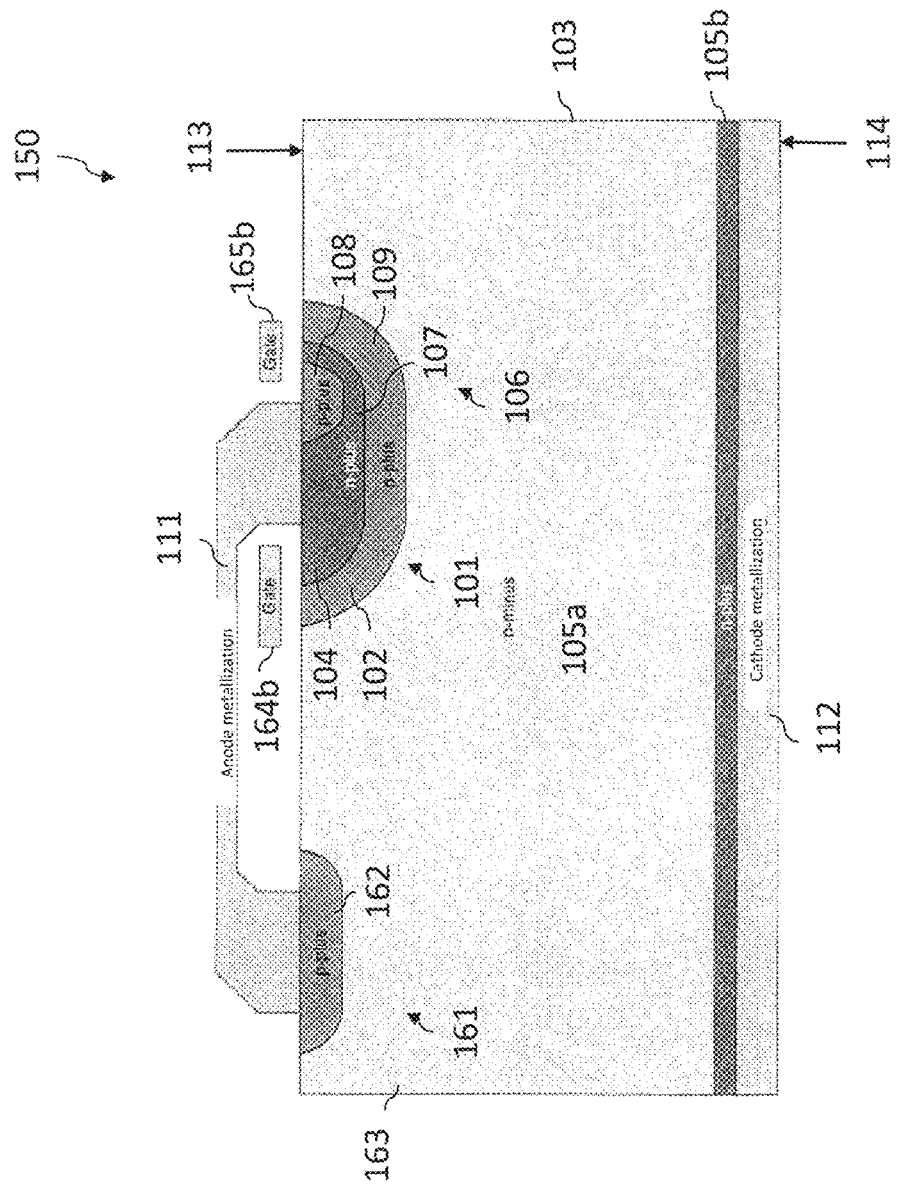
FIG. 1B shows a semiconductor device including a first transistor structure and a second transistor having shared doping regions according to an embodiment.

FIG. 1B shows a schematic illustration of a semiconductor device 150 according to an embodiment.

The semiconductor device 150 may be similar to the semiconductor device (e.g. 100) described with respect to FIG. 1A.

Additionally or optionally, the first transistor body region 102 and the second source/drain region 109 of the second transistor structure 106 may be implemented by or formed by a common semiconductor doping region of the first conductivity type in the semiconductor substrate 103. In other words, the first transistor body region 102 and the second source/drain region 109 of the second transistor structure 106 may be the same doping region (e.g. a first doping region) in the semiconductor substrate 103.

Additionally or optionally, the second transistor body region 107 and the first source/drain region 104 of the first transistor structure 101 may be implemented by a common semiconductor doping region of the second conductivity type in the semiconductor substrate 103, for example. In other words, the second transistor body region 107 and the first source/drain region 104 of the first transistor structure 101 may be a shared or the same doping region (e.g. a second doping region) in the semiconductor substrate 103.

The second doping region (which may include the first source/drain region 104 of the first transistor structure and the second transistor body region 107) may be formed around or at least partially surround a doping region including (e.g. comprising) the first source/drain region 108 of the second transistor structure, for example.

The first doping region (which may be the second source/drain region 109 of the second transistor structure and the first transistor body region 102) may be formed around or at least partially surround the second doping region (the first source/drain region 104 of the first transistor structure and the second transistor body region 107), for example.

A doping region including (e.g. comprising) the second source/drain region 105 of the first transistor structure may be formed around or at least partially surround a doping region including (e.g. comprising) the second source/drain region 109 of the second transistor structure.

Additionally or optionally, the semiconductor device may further include a field stop region (or layer) of the second conductivity type formed between the drift region and the emitter region. The field stop region may have a dopant concentration which may be higher than the dopant concentration of the drift region but lower than the dopant concentration of the emitter region, for example.

The semiconductor device 150 may further include a diode structure 161 which may include an anode with lower efficiency. The diode structure 161 may include a first diode doping region 162 of the first conductivity type and a second diode doping region 163 of the second conductivity type within the semiconductor substrate 103. The first diode doping region 162 of the first conductivity type and the second diode doping region 163 of the second conductivity type may be formed adjacent to each other to form a p-n junction diode.

The first diode doping region 162 may be formed just below the front surface 113 or nearer to the front side of the semiconductor substrate than the second diode doping region 163. The first diode doping region 162 may be electrically connected to the first electrode structure 111 which may be formed adjacent to or on (e.g. directly on) the first diode doping region 162. The first diode doping region 162 may have a dopant concentration which lies between $1\times10^{15}$ to $1\times10^{17}$ cm$^{-3}$, or e.g. between $5\times10^{15}$ to $1\times10^{17}$ cm$^{-3}$, or e.g. between $1\times10^{16}$ to $1\times10^{17}$ cm$^{-3}$, for example.

The second diode doping region 163 and the second source/drain region of the first transistor structure may be implemented by a common semiconductor doping region (e.g. the bulk drift region) of the second conductivity type. The second diode doping region 163 and the second source/drain region of the first transistor structure may further include the emitter region of the second conductivity type (e.g. a highly doped n+ region), for example.

By operating the diode (e.g. the diode structure 161) in the forward direction and e.g. through a gate anode voltage of 0V, a positive voltage drop may be attained in the drift area due to the currently active partial anode (e.g. the diode structure 161 may be forward biased). In the forward bias state, the first electrode structure may have a voltage of 0V, and the second electrode structure may have a voltage ranging from −5 V to −100V, for example. The structure (e.g. semiconductor device) may be in a bipolar mode having voltage blocking capability enabled, and the charge carrier concentration may be moderate. The structure may be in a blocking-enabled "high speed" state.

If the potential difference between the n-plus region (e.g. the first source/drain region 104) and the gate 164b of the first transistor structure exceeds a threshold voltage of the first transistor (e.g. a gate-anode voltage is greater than or equal to +5V), a (surface) channel of charge carriers of a second conductivity type (e.g. an n-channel) may be formed in the p+ region (e.g. in the first transistor body region 102). The structure (e.g. semiconductor device) may be in a unipolar mode having voltage blocking capability disabled, and the charge carrier concentration may be low. Through the positive gate anode voltage, the structure may be brought into a unipolar mode (ultra high speed mode) without voltage blocking capability, for example. For example, a flow of an electron current along the n− channel between the second source/drain region 105 of the first transistor and the first source/drain region 104 of the first transistor structure may be enabled, thus reducing the charge carrier concentration within the drift region 105. There, a particularly low carrier charge concentration may result and thus ultra high speed switching may be attained.

The blocking-enabled "high speed" state must be set again before the reverse recovery, for example, by applying a gate anode voltage below the threshold voltage of the first transistor (for example, by applying a gate anode voltage of 0V). During reverse recovery a blocking voltage between the first electrode structure 111 and the second electrode region 112 is applied. For example, a voltage of 0 V may be applied at the first electrode structure and a voltage of between 600 V to 6500 V may be applied at the second electrode region, for example.

For a gate anode voltage below the threshold voltage of the second transistor (e.g. −15 V), a a (surface) channel of charge carriers of a first conductivity type (e.g. a p channel) may be formed in the n-plus region (e.g. the second tran-sistor body region 107). This may result in an increased charge carrier concentration (e.g. of electrons and holes) in the drift region, for example. The anode may be coupled with a higher efficiency (e.g. the first electrode structure may have a voltage of 0V, and the second electrode structure may have a voltage ranging from −1 V to −3 V) and the diode may be in a higher charge carrier concentration state ("low saturation voltage" or "low sat" state).

The switchable structure of the diode may optionally be achieved with an anode metallization or with many anode metallizations and a common p+ region. In some examples, the contact layer may lie on the surface or may partially protrude in the n+ region. In some examples, a Schottky contact for connection of the n+ region may optionally be used. In some examples, the controllable diode may be realized as a trench variant or a mixed trench-planar variant.

The examples described herein (above and below) may be applied with respect to diode (e.g. a diode structure 161) which may accommodate voltages in the high speed state and the low sat states, and which may achieve a large spreading of the charge carrier concentration between the high speed and the low sat states, and at the same time higher latch-up strength. This may be achieved by a separation of the current paths for electron current and hole current in the switchable structure, for example.

The parallel circuit of the currently active partial anode with low emitter efficiency and a switchable structure over the MOS channel, makes three states with different charge carrier concentrations possible, for example.

Higher voltage classes in the kilovolts (kV) range may have unsatisfactory anode efficiency. Anode efficiency in diodes may be controlled by setting a gate terminal from a state of low forward voltage (low saturation voltage) to a state of low storage charge (high speed) before the reverse recovery. For example, it may be possible to use the body diode of a MOSFET as a controllable diode and the MOSFET as a first transistor. The diode may have two states. In the high speed state, the diode may be operated unipolarly. One attains a very small storage charge, but the diode may receive no blocking voltage in this state. It may be brought into the "low sat" state which enables blocking during the reverse recovery, which may then cause it to lose some of its functional performance by increasing the reverse recovery charge.

Another diode may have or use an additionally control body, for example. The diode may operate in two voltage switching states. However, the realizable spreading between the "high speed" and the "low sat" state is not too large, for example.

Another permanently active partial anode with low emitter efficiency (higher transmission resistance) may be used to switch with high efficiency a switchable structure over a MOS channel. The diode may operate in two voltage switching states and may allow a larger spreading of the charge carrier concentration between the "high speed" and the "low sat" states. However, the structure does not necessarily achieve satisfactory latch strength at higher current density, for example.

One or more of these challenges may be circumvented by the examples described herein (above and below).

More details and aspects are mentioned in connection with the embodiments described above or below. The embodiments shown in FIG. 1B may comprise one or more optional additional features corresponding to one or more aspects mentioned in connection with the proposed concept or one or more embodiments described above (e.g. FIG. 1A) or below (e.g. FIGS. 2 to 1).

Figure 2:
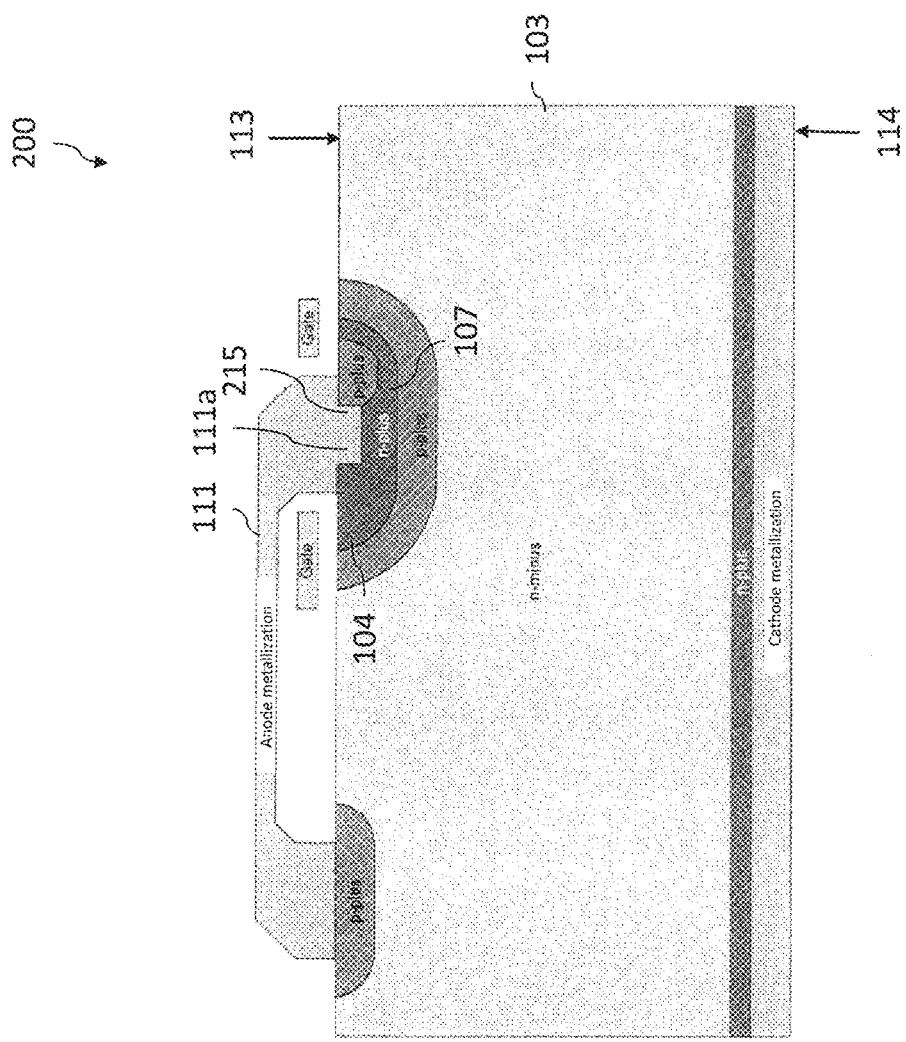
FIG. 2 shows a semiconductor device having a trench electrode structure according to an embodiment.

FIG. 2 shows a schematic illustration of a semiconductor device 200 with a trench structure according to an embodiment.

The semiconductor device 200 may be similar to the semiconductor devices described with respect to FIGS. 1A and 1B. The semiconductor device 200 may include a diode structure with deeper anode metallizations.

Additionally or optionally, the semiconductor device 200 may include a trench structure 215 formed in the semiconductor substrate 103. The trench structure 215 may be formed in semiconductor substrate 103 by removing semiconductor substrate material from the first source/drain region 104 of the first transistor structure and/or the first source/drain region 108 of the second transistor structure, for example. The trench structure 215 may have a trench depth extending into the semiconductor substrate 103 which may be less than a depth of the second doping region (the second transistor body region 107 and the first source/drain region 104 of the first transistor structure 101) from the front surface 113 of the semiconductor substrate.

The trench structure 215 may be formed within at least one of the first source/drain region 104 of the first transistor structure and the first source/drain region 108 of the second transistor structure, for example. The trench structure 215 may be directly adjacent to the second doping region (e.g. the trench structure 215 may be directly adjacent to the first source/drain region 104 of the first transistor structure). Furthermore, the trench structure 215 may be directly adjacent to the first source/drain region 108 of the second transistor structure, for example.

At least part of the first electrode structure 111 may be formed in the trench structure 215 which may be formed within at least one of the first source/drain region 104 of the first transistor structure and the first source/drain region 108 of the second transistor structure. At least part of the first electrode structure 111 may include a first electrode trench structure 111a which refers to the part of the first electrode structure formed within the trench structure 215.

The first electrode structure 111 may be formed in the trench structure 215 by depositing electrically conductive material into the trench structure 215. The part of the first electrode structure 111 within the trench structure 215 (the first electrode trench structure 111a) may be at least partially surrounded by the first source/drain region 104 of the first transistor structure and the first source/drain region 108 of the second transistor structure, for example. Further parts of the first electrode structure may be formed on the front surface 113 of the semiconductor substrate, e.g. on portions of the first source/drain region 104 of the first transistor structure and the portions of the first source/drain region 108 of the second transistor structure lying at the front surface 113 of the semiconductor substrate 103.

The first electrode structure 111 formed in the trench structure 215 may improve latch up in the semiconductor device by reducing the resistance experienced by the flow of electrons into the first electrode structure 111.

More details and aspects are mentioned in connection with the embodiments described above or below. The embodiments shown in FIG. 2 may comprise one or more optional additional features corresponding to one or more aspects mentioned in connection with the proposed concept or one or more embodiments described above (e.g. FIGS. 1A to 1B) or below (e.g. FIGS. 3 to 17).

Figure 3:
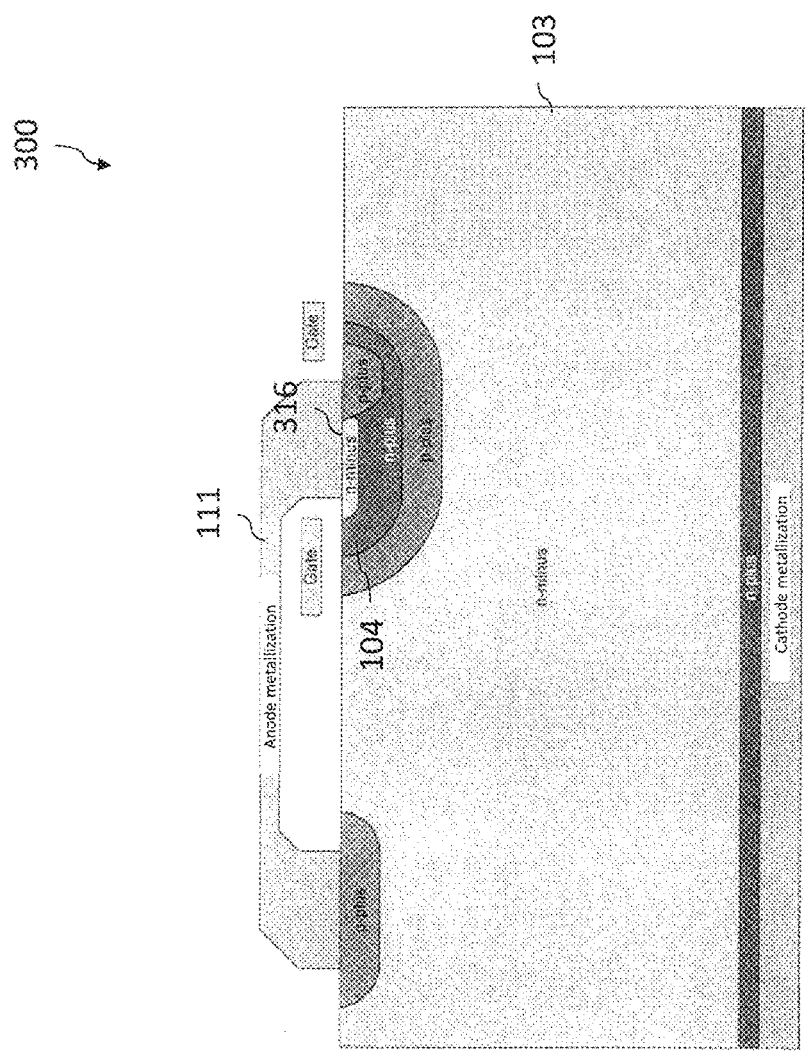
FIG. 3 shows a semiconductor device having a lightly doped region according to an embodiment.

FIG. 3 shows a schematic illustration of a further semiconductor device 300 according to an embodiment.

The semiconductor device 300 may be similar to the semiconductor devices described with respect to FIGS. 1A to 2. The semiconductor device 300 may include a diode with a Schottky contacted n+ region, for example.

Additionally or optionally, the semiconductor device 300 may include a lightly doped region 316 of the second conductivity type (e.g. n– region) located between the first source/drain region 104 of the first transistor structure and the first electrode structure 111, for example.

The lightly doped region 316 may have a dopant concentration which lies between $1\times10^{15}$ cm$^{-3}$ to $1\times10^{19}$ cm$^{-3}$, or e.g. between $1\times10^{16}$ to $1\times10^{18}$ cm$^{-3}$, or e.g. between $5\times10^{16}$ to $5\times10^{17}$ cm$^{-3}$, for example. The lightly doped region 316 of the second conductivity type may be directly adjacent to the first electrode structure 111, which may be formed on the lightly doped region 316, for example. The lightly doped region 316 of the second conductivity type and the first electrode structure 111 may form a Schottky barrier contact, for example.

The Schottky barrier contact may reduce switching losses when the diode switches from the ON (conducting) state to the OFF (blocking) state. For example, holes may be removed from the semiconductor front side and electrons may be prevented from being injected from the source/drain region.

More details and aspects are mentioned in connection with the embodiments described above or below. The embodiments shown in FIG. 3 may comprise one or more optional additional features corresponding to one or more aspects mentioned in connection with the proposed concept or one or more embodiments described above (e.g. FIGS. 1A to 2) or below (e.g. FIGS. 4 to 17).

Figure 4:
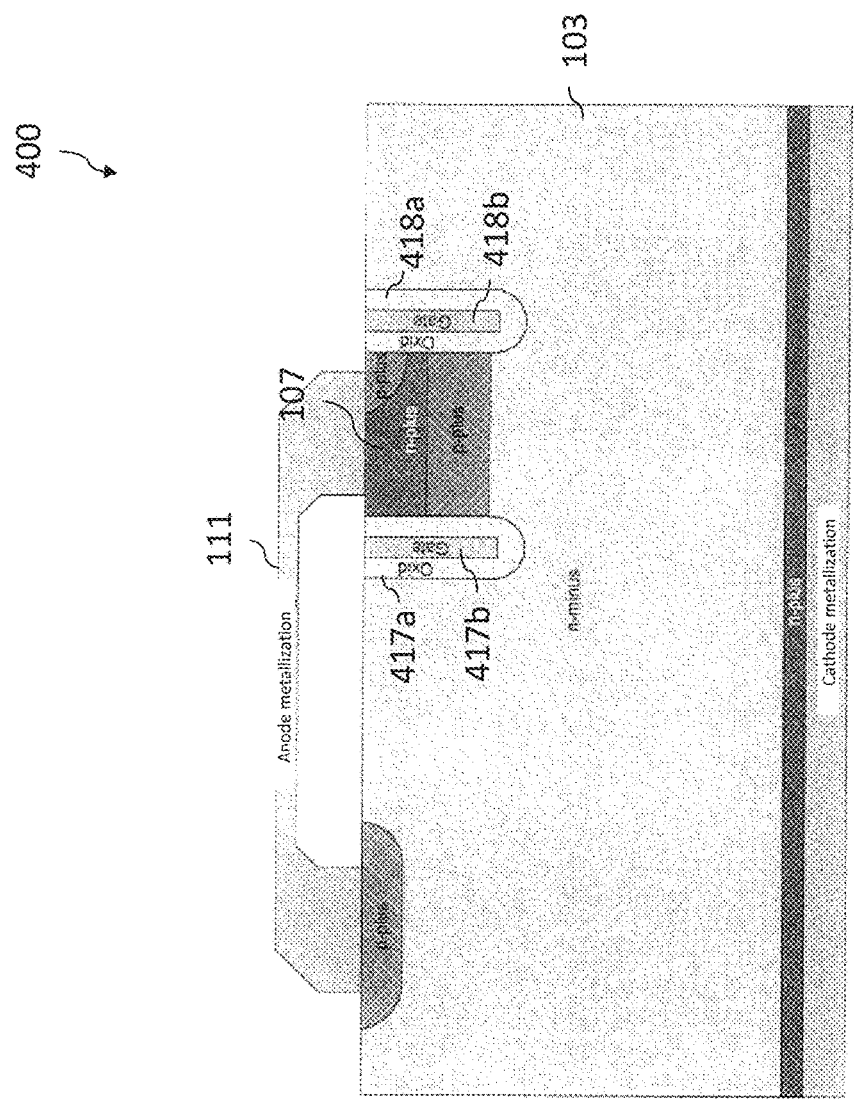
FIG. 4 shows a semiconductor device having one or more trench gate structures according to an embodiment.

FIG. 4 shows a schematic illustration of a further semiconductor device 400 according to an embodiment.

The semiconductor device 400 may be similar to the semiconductor devices described with respect to FIGS. 1A to 3. The semiconductor device 400 may include a diode as a trench planar variation, for example.

The semiconductor device 400 may include a first trench gate insulation region (or layer) 417a formed on the inside sidewalls of a vertical trench or cavity extending into the semiconductor substrate. The semiconductor device 400 may include a first trench gate structure 417b, which may comprise electrically conductive material formed in the vertical trench or cavity, for example. The first trench gate insulation region (or layer) 417a may be formed around or at least partially surround the first trench gate structure 417b.

The first trench gate insulation region (or layer) 417a may be located between the first trench gate structure 417b and the first transistor body region 102. The first trench gate insulation region (or layer) 417a may be (directly) adjacent to the first transistor body region 102 (e.g. the first doping region) and/or the first source/drain region 104 of the first transistor structure (e.g. the second doping region), for example.

The semiconductor device 400 may further include a second trench gate structure 418b and a second trench gate insulation region 418a. The second trench gate structure 418b and the second trench gate insulation region 418a may be formed in a similar manner and/or may have the same or similar structure as the first trench gate structure 417b and the first trench gate insulation region 417a The second trench gate structure 418b may be formed adjacent to the second transistor body region 107. For example, the second trench gate structure 418b may contact the second transistor body region 107 on an opposite side of the first doping region from the first trench gate structure 417b, for example.

In some examples, the first trench gate structure 417b and the second trench gate structure 418b may extend into the semiconductor substrate by the same depth. For example, a trench depth of the first trench gate structure 417b and a trench depth of the second trench gate structure may be substantially equal. The first trench gate structure 417b and the second trench gate structure 418b may be part of a common continuous trench structure or may be separate trench structures, for example.

In some examples of semiconductor devices including vertical trench gate structures, the first source/drain region 104 of the first transistor structure, the first transistor body region 102 and the second source/drain region 105 of the first transistor structure may be formed or arranged vertically with respect to each other in the semiconductor substrate 103.

More details and aspects are mentioned in connection with the embodiments described above or below. The embodiments shown in FIG. 4 may comprise one or more optional additional features corresponding to one or more aspects mentioned in connection with the proposed concept or one or more embodiments described above (e.g. FIGS. 1A to 3) or below (e.g. FIGS. 5 to 17).

Figure 5:
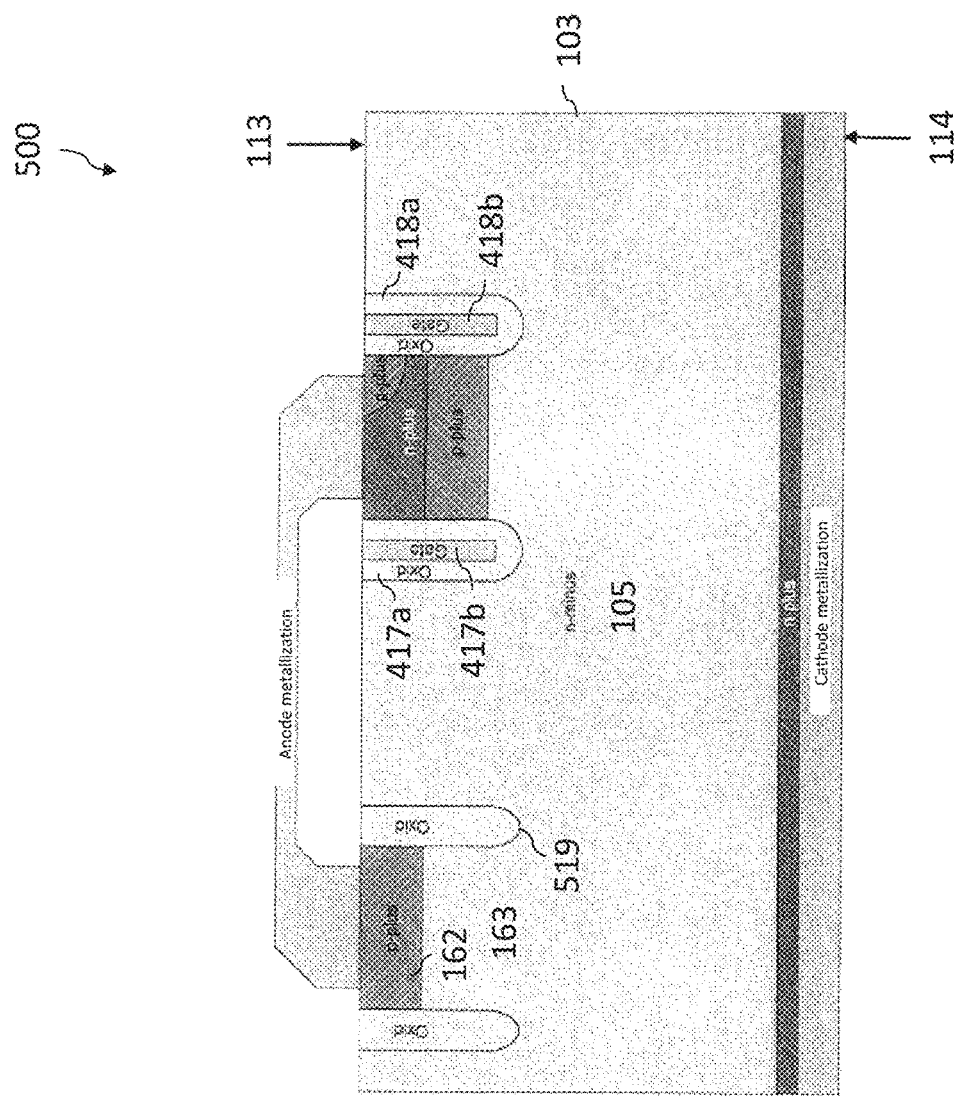
FIG. 5 shows a semiconductor device having at least one isolation trench structure according to an embodiment.

FIG. 5 shows a schematic illustration of a further semiconductor device 500 according to an embodiment.

The semiconductor device 500 may be similar to the semiconductor devices described with respect to FIGS. 1A to 4. The semiconductor device 500 may include a diode as a trench variation, for example.

Additionally or optionally, the semiconductor device 500 may further include at least one isolation trench structure 519 extending into the semiconductor substrate 103. The at least one isolation trench structure 519 may be implemented by a vertical trench or cavity extending into the semiconductor substrate. The vertical trench or cavity may be formed around the first diode doping region 162 of the diode structure 161, for example. The vertical trench or cavity may be filled with or may include electrically insulating material (e.g. silicon dioxide or Tetraethyl orthosilicate TEOS) deposited within the vertical trench or cavity.

The at least one isolation trench structure 519 may be formed around or at least partially surround the first diode doping region 162 of the diode structure 161. For example, the at least one isolation trench structure 519 may be formed adjacent to the first diode doping region 162 of the diode structure 161. The isolation trench structure 519 may extend deeper into the semiconductor substrate (from the front surface 113 of the semiconductor substrate) than the first diode doping region 162, for example. For example, the isolation trench structure 519 may extend into the drift region, e.g. parts of the drift region below the first diode doping region 162. For example, the drift region (which may also be the second diode doping region 163 of the diode structure 161) may surround parts (or surfaces) of the isolation trench structure 519 which are not directly adjacent to the first diode doping region 162 of the diode structure 161.

More details and aspects are mentioned in connection with the embodiments described above or below. The embodiments shown in FIG. 5 may comprise one or more optional additional features corresponding to one or more aspects mentioned in connection with the proposed concept or one or more embodiments described above (e.g. FIGS. 1A to 4) or below (e.g. FIGS. 6 to 17).

Figure 6:
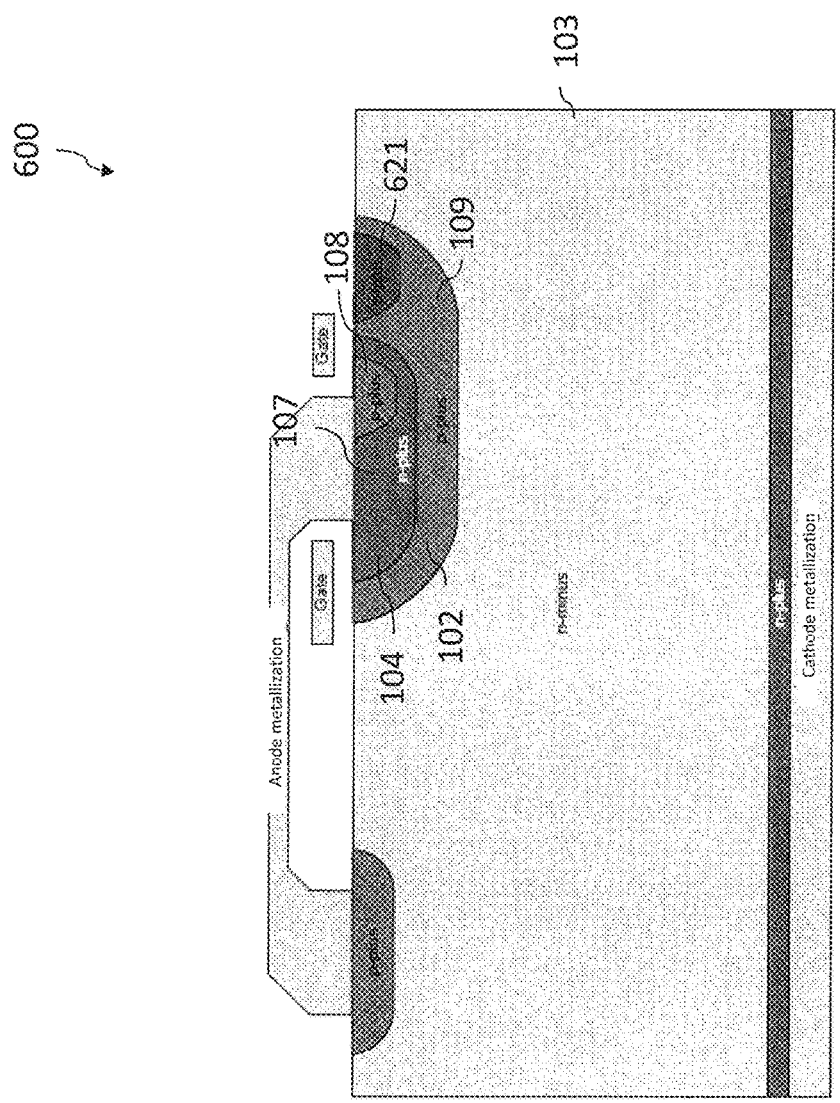
FIG. 6 shows a semiconductor device having a highly doped region according to an embodiment.

FIG. 6 shows a schematic illustration of a further semiconductor device 600 according to an embodiment.

The semiconductor device 600 may be similar to the semiconductor devices described with respect to FIGS. 1A to 5.

Additionally or optionally, the semiconductor device 600 may further include a highly doped region 621 of the first conductivity type (e.g. a p++ region) formed in the doping region comprising the second source/drain region 109 of the second transistor structure.

The highly doped region 621 may be formed at the front surface 113 of the semiconductor substrate 103 in the second source/drain region 109 of the second transistor structure. The first transistor body region 102 and part of the second source/drain region 109 of the second transistor structure may be formed between the highly doped region 621 and the first transistor source/drain region 108 of the second transistor structure, for example.

The highly doped region 621 of the first conductivity type (e.g. a p++ region) may have a dopant concentration which is greater than $1\times10^{17}$ cm$^{-3}$, e.g. between $1\times10^{17}$ to $1\times10^{20}$ cm$^{-3}$, or e.g. between $1\times10^{17}$ to $1\times10^{19}$ cm$^{-3}$, or e.g. between $5\times10^{17}$ to $5\times10^{18}$ cm$^{-3}$, for example. The highly doped region 621 of the first conductivity type (e.g. a p++ region) may have a dopant concentration which is greater than the dopant concentration of the first doping region, e.g. higher than the dopant concentration of the first transistor body region 102, or higher than the dopant concentration of the second source/drain region 109 of the second transistor structure, for example.

The highly doped region 621 of the first conductivity type may redirect a current path through the doping region comprising the second source/drain region 109 of the second transistor structure. The redirected current path 623 through the second transistor structure may be different, e.g. enlarged, in comparison to a current path without the highly doped region. For example, electrons may be redirected away from and/or around the highly doped region 621. By enlarging the current path, latch stability may be improved, as current density may be reduced due to the longer current path, for example.

More details and aspects are mentioned in connection with the embodiments described above or below. The embodiments shown in FIG. 6 may comprise one or more optional additional features corresponding to one or more aspects mentioned in connection with the proposed concept or one or more embodiments described above (e.g. FIGS. 1A to 5) or below (e.g. FIGS. 7A to 17).

Figure 7A:
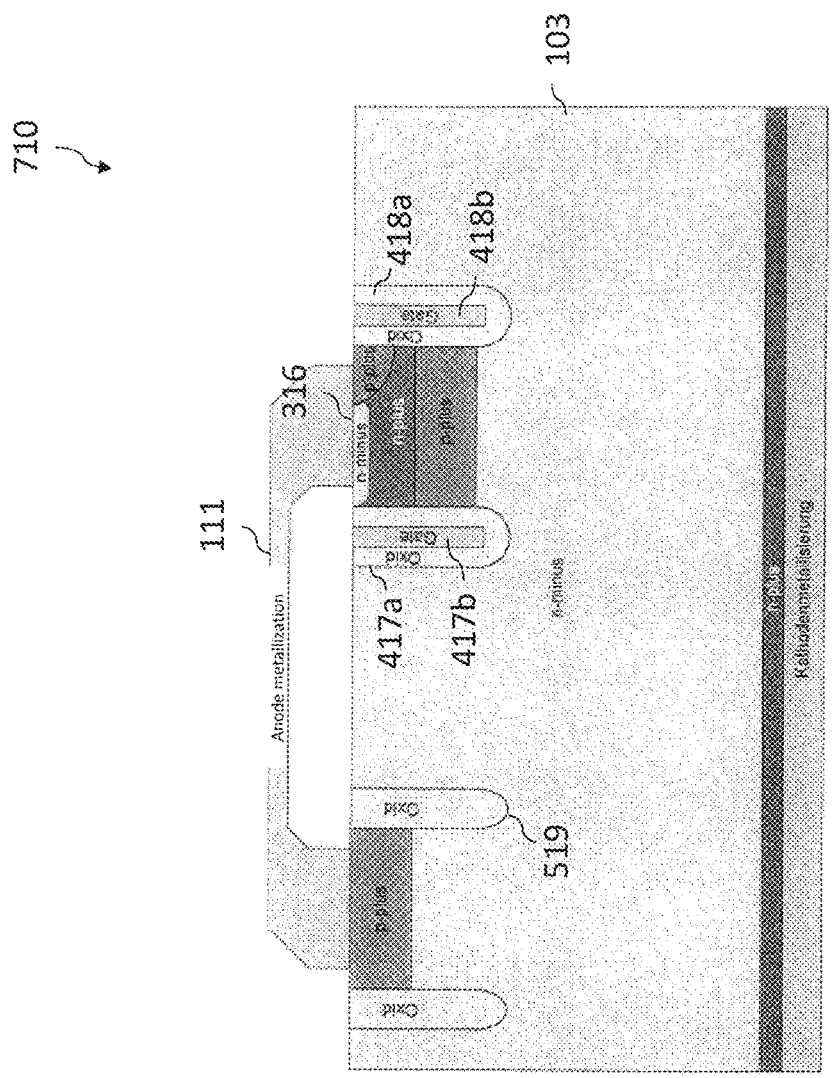
FIG. 7A shows a semiconductor device having a trench gate structure, an isolation trench structure and a lightly doped region according to an embodiment.

FIG. 7A shows a schematic illustration of a further semiconductor device 710 according to an embodiment.

The semiconductor device 710 may be similar to the semiconductor devices described with respect to FIGS. 1A to 6. The semiconductor device 710 may include a diode as a trench variation with a Schottky contacted n+ region, for example.

Additionally, optionally or alternatively, the semiconductor device 710 may include the lightly doped region 316 described with respect to FIG. 3 and the first trench gate 417 and the second trench gate 418 described with respect to FIG. 4, for example.

Figure 7B:
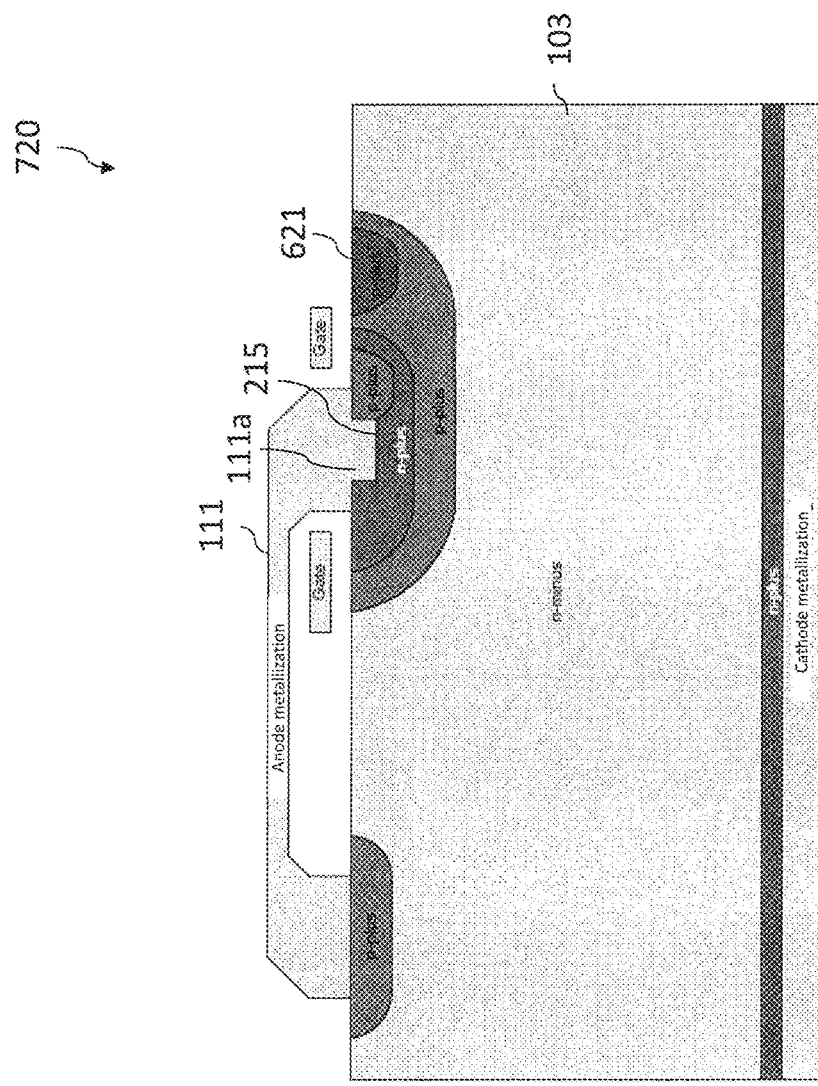
FIG. 7B shows a semiconductor device having an electrode trench structure and a highly doped region according to an embodiment.

FIG. 7B shows a schematic illustration of a further semiconductor device 720 according to an embodiment. The semiconductor device 720 may include a diode with a deeper anode metallization and a local highly doped p++ region, for example.

The semiconductor device 720 may additionally include the first electrode trench structure 111a formed in the trench structure 215 described with respect to FIG. 2 and the highly doped region 621 of the first conductivity type (e.g. a p++ region) described with respect to FIG. 6, for example.

The lightly doped region 316 described with respect to FIG. 3 and the first trench gate 417 and the second trench gate 418 described with respect to FIG. 4 may be optionally included in the semiconductor device 720, for example.

Figure 7C:
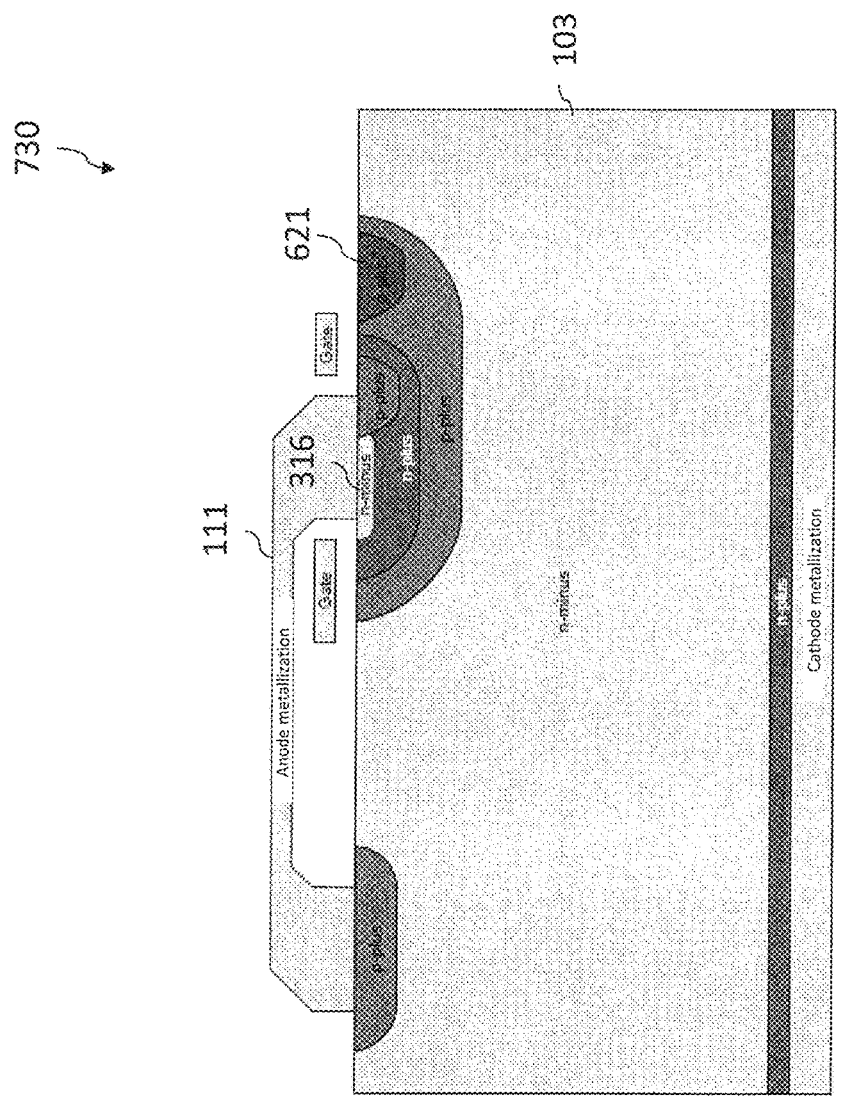
FIG. 7C shows a semiconductor device having a lightly doped region and a highly doped region according to an embodiment.

FIG. 7C shows a schematic illustration of a further semiconductor device 730 according to an embodiment. The semiconductor device 7320 may include a diode with a Schottky contacted n+ region and a local highly doped p++ region, for example.

The semiconductor device 730 may include the lightly doped region 316 of the second conductivity type (e.g. n− region) described with respect FIG. 3 and the highly doped region 621 of the first conductivity type (e.g. a p++ region) described with respect to FIG. 6, for example.

The semiconductor device 730 may include the lightly doped region 316 of the second conductivity type and/or the first electrode trench structure 111a, for example.

Figure 7D:
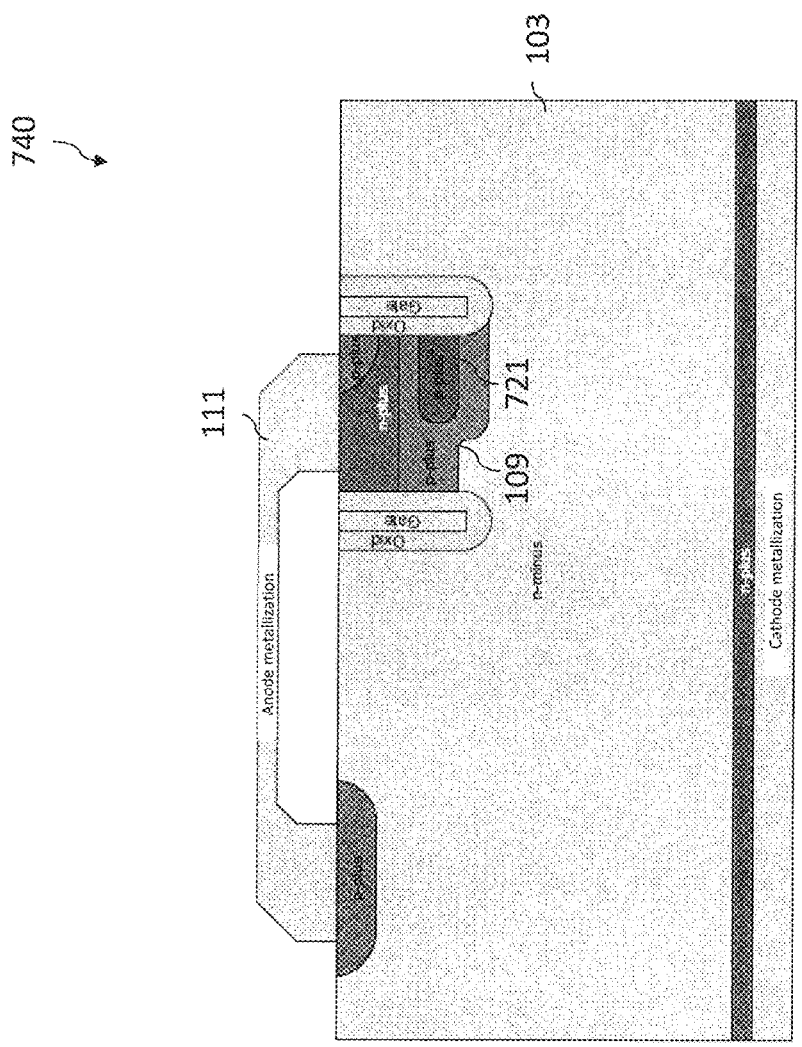
FIG. 7D shows a semiconductor device having a trench gate structure and a highly doped region according to an embodiment.

FIG. 7D shows a schematic illustration of a further semiconductor device 740 according to an embodiment. The semiconductor device 740 may include a diode as a trench-planar variation with a local highly doped p++ region, for example.

The semiconductor device 740 may include a highly doped region 721 of the first conductivity type (e.g. a p++ region) and the first trench gate 417 and the second trench gate 418 described with respect to FIG. 4, for example.

The highly doped region 721 may be formed in the second source/drain region 109 of the second transistor structure 106, for example. The highly doped region 721 may be formed adjacent (directly adjacent) to the second trench gate 418, for example.

The highly doped region 721 may redirect or enlarge the current path through the second source/drain region 109 of the second transistor structure so that electrons may be directed away from areas where parasitic field effect transistors (FET) may be formed, for example. For example, the new electron path may be directed towards the first electrode structure 111. The highly doped region 721 may prevent or weaken the injection of electrons from the first source/drain region of the first transistor structure during commutation of the diode.

Figure 7E:
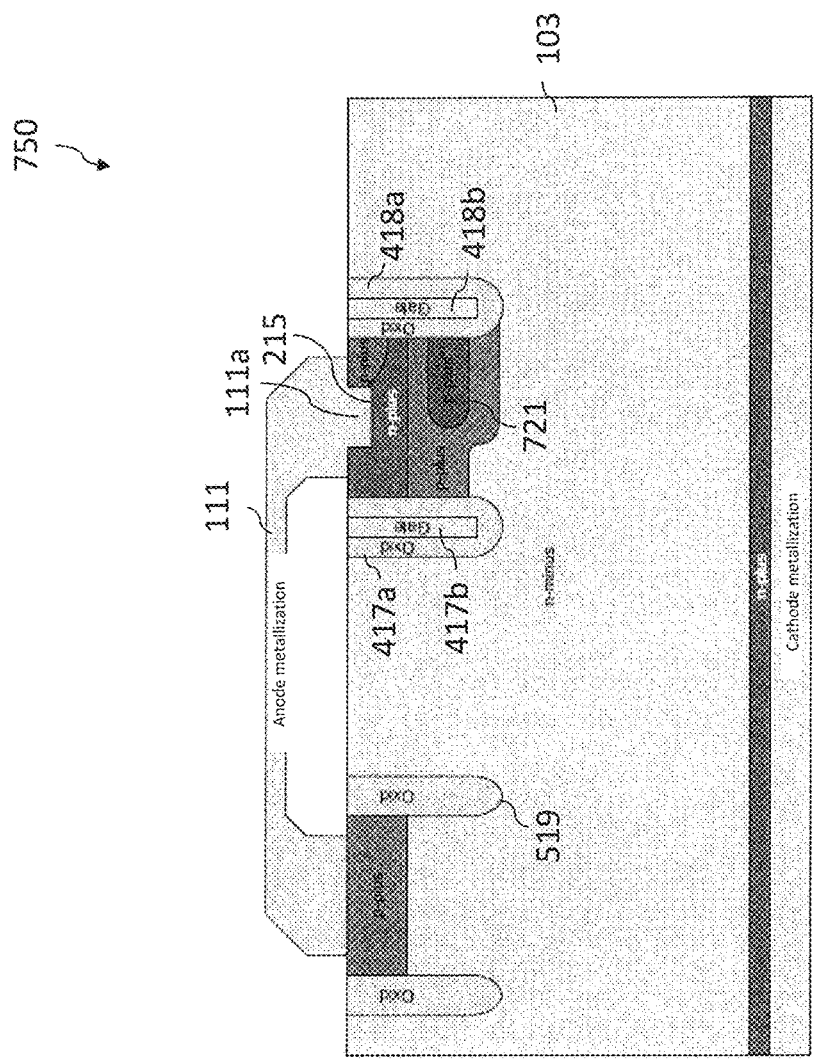
FIG. 7E shows a semiconductor device having a trench gate structure, an isolation trench structure, an electrode trench structure and a highly doped region according to an embodiment.

FIG. 7E shows a schematic illustration of a further semiconductor device 750 according to an embodiment. The semiconductor device 750 may include a diode as a trench variation with deeper anode metallization and a local highly doped p++ region, for example.

Additionally, optionally or alternatively, the semiconductor device 750 may include the highly doped region 721 of the first conductivity type (e.g. a p++ region) described with respect to FIG. 7D, the isolation trench structure 519 described with respect to FIG. 5 and the first trench gate 417 and the second trench gate 418 described with respect to FIG. 4, for example. The semiconductor device 750 may further include the first electrode trench structure 111a described with respect to FIG. 2.

Figure 7F:
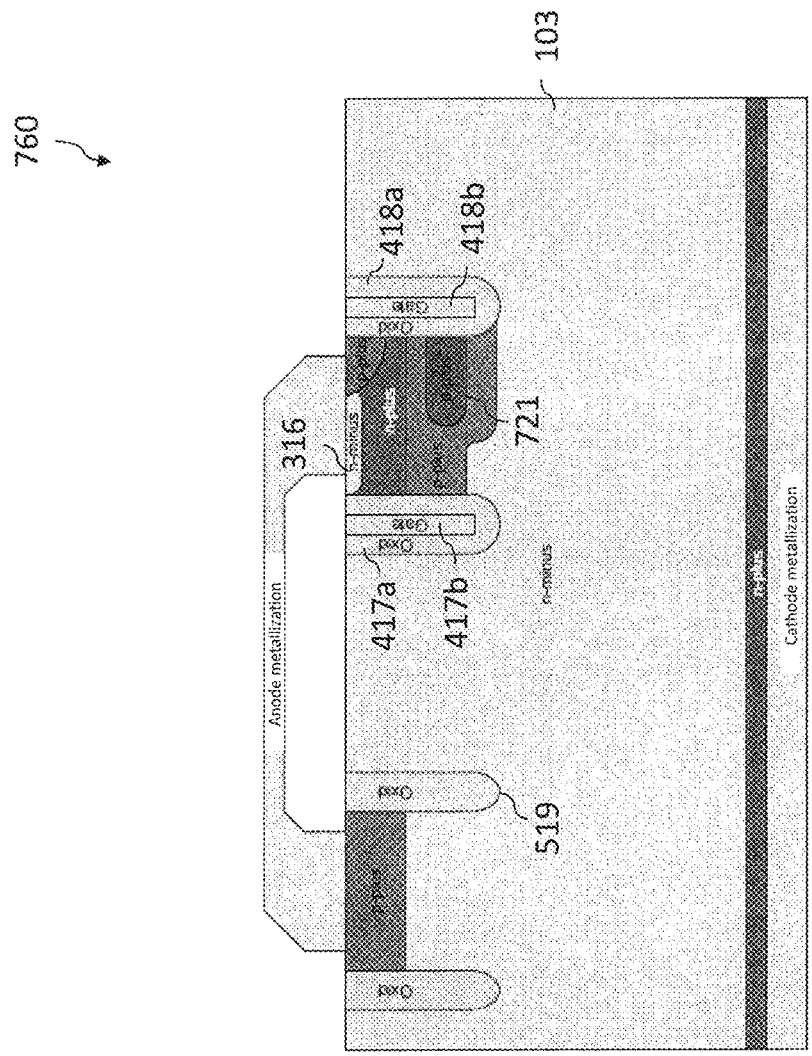
FIG. 7F shows a semiconductor device having a trench gate structure, an isolation trench structure, a lightly doped region and a highly doped region according to an embodiment.

FIG. 7F shows a schematic illustration of a further semiconductor device 760 according to an embodiment. The semiconductor device 760 may include a diode as a trench variation with a Schottky contacted n+ region and a local highly doped p++ region 721, for example.

In addition to the features described with respect to FIG. 7E, the semiconductor device 760 may include the lightly doped region 316 of the second conductivity type (e.g. n− region) described with respect FIG. 3 instead of or in addition to the first electrode trench structure 111a.

The highly doped p++ region 721 may extend laterally in the semiconductor substrate (e.g. in a direction horizontally to the main surface of the semiconductor substrate) away from the second trench gate structure 418b. The highly doped p++ region 721 may have a larger lateral extension away from the second trench gate structure 418b than the first source/drain region 108 (e.g. p+ region) of the second transistor structure. For example, the highly doped p++ region 721 may have a larger horizontal dimension or width than the first source/drain region 108 from the second trench gate structure 418b. For example, the highly doped p++ region 721 and the first source/drain region 108 may overlap or extend into the same vertical plane of the semiconductor substrate.

More details and aspects are mentioned in connection with the embodiments described above or below. The embodiments shown in FIGS. 7A to 7F may comprise one or more optional additional features corresponding to one or more aspects mentioned in connection with the proposed concept or one or more embodiments described above (e.g. FIGS. 1A to 6) or below (e.g. FIGS. 8 to 17).

Figure 8:
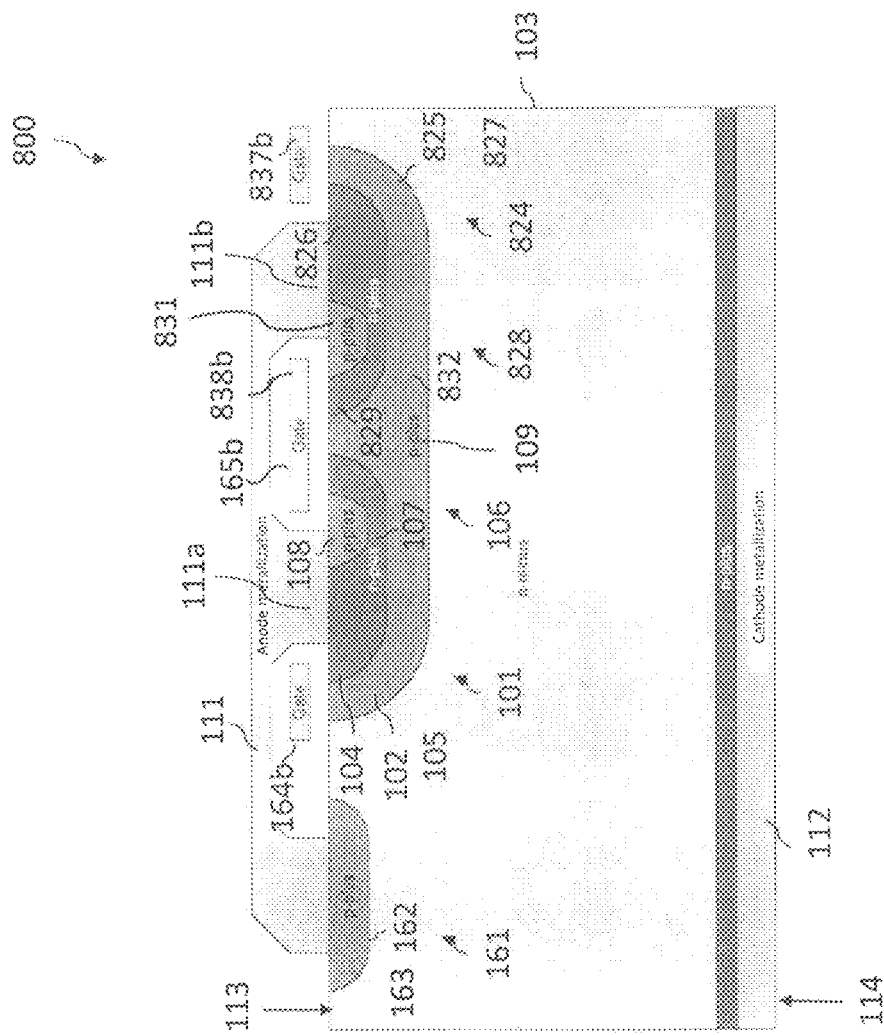
FIG. 8 shows a semiconductor device having four transistor structures according to an embodiment.

FIG. 8 shows a schematic illustration of a further semiconductor device 800 according to an embodiment.

The semiconductor device 800 may be similar to the semiconductor devices described with respect to FIGS. 1A to 7F. The semiconductor device 800 may include a diode and may have two anode metallizations and a common p+ region, for example.

The semiconductor device 800 may further include a third transistor structure 824. The third transistor structure 824 may include a third transistor body region 825 of the first conductivity type located within the semiconductor substrate 103. At least part of the third transistor body region 825 may be located between a first source/drain region 826 of the third transistor structure and a second source/drain region 827 of the third transistor structure.

The semiconductor device 800 may further include a fourth transistor structure 828. The fourth transistor structure 828 may include a fourth transistor body region 829 of a second conductivity type located within the semiconductor substrate 103. At least part of the fourth transistor body region 829 may be located between a first source/drain region 831 of the fourth transistor structure and a second source/drain region 832 of the fourth transistor structure 828.

The first electrode structure 111 may be in electrical connection with the first source/drain region 826 of the third transistor structure and the first source/drain region 831 of the fourth transistor structure.

The first electrode structure 111 may include the first partial structure 111a of the first electrode, which may be in electrical connection (or contact) with the first source/drain region 104 of the first transistor structure and the first source/drain region 108 of the second transistor structure. The first electrode structure 111 may include a second partial structure 111b of the first electrode, which may be in electrical connection (or contact) with the first source/drain region 826 of the third transistor structure and the first source/drain region 831 of the fourth transistor structure.

The second source/drain region 827 of the third transistor structure and the second source/drain region of the first transistor structure may be implemented by a common semiconductor doping region of the second conductivity type in the semiconductor substrate 103.

The third transistor structure 824 and the fourth transistor structure 825 may be formed in the semiconductor substrate with respect to each other similarly (or identically) to the first transistor structure 101 and the second transistor structure 106. For example, additionally or optionally, the third transistor body region 825 and the second source/drain region 832 of the fourth transistor structure 828 may be implemented by or formed by a common semiconductor doping region of the first conductivity type in the semiconductor substrate 103. Additionally or optionally, the fourth transistor body region 829 and the first source/drain region 826 of the third transistor structure 824 may be implemented by a common semiconductor doping region of the second conductivity type in the semiconductor substrate 103, for example.

In some examples, the first transistor structure 101 may be located adjacent to the second transistor structure 106. Additionally or optionally, the fourth transistor structure 828 may be located adjacent to the second transistor structure 106, and between the second transistor structure 106 and the third transistor structure 824. In some examples, the doping regions of the first transistor structure 101 and the second transistor structure 106 may be symmetrical about a (vertical) line of symmetry to the doping regions of the third transistor structure 824 and the fourth transistor structure 828.

Additionally or optionally, the first transistor body region 102, the second source/drain region 109 of the second transistor structure 106, the third transistor body region 825, the second source/drain region 832 of the fourth transistor structure 828 may be the same doping region (e.g. the first doping region) in the semiconductor substrate 103. At least part of the first doping region may be formed between the second transistor structure 106 and the fourth transistor structure 828, for example.

The semiconductor device 800 may further include a gate 837b of the third transistor structure. A transistor channel of the third transistor structure controllable by the gate 837b of the third transistor structure may be limited to a channel region located between the first source/drain region 826 of the third transistor structure 824 and the second source/drain region 827 of the third transistor structure.

The gate 837b of the third transistor structure may cover the third transistor body region 825 at the front surface 113 of the semiconductor substrate, and/or partially or fully cover the first source/drain region 826 of the third transistor structure at the front surface 113 of the semiconductor substrate and/or partially or fully cover the second source/drain region 827 of the third transistor structure at the front surface 113 of the semiconductor substrate. For example, a first edge of the gate 837b the third transistor structure may be located on (e.g. may terminate on) the first source/drain region 826 of the third transistor structure 824 and a second edge of the gate 837b of the third transistor structure may be located on (e.g. may terminate on) the second source/drain region 827 of the third transistor structure, for example.

The semiconductor device 800 may further include a third gate insulation layer formed between the front surface 113 of the semiconductor substrate 103 and the gate 837b of the third transistor structure. The third gate insulation layer may be formed directly on or adjacent to the front surface 113 of the semiconductor substrate 103, for example. For example, a first edge of the third gate insulation layer may be located over or on (e.g. may terminate on) the first source/drain region 826 of the third transistor structure and a second edge of the third gate insulation layer may be located on (e.g. may terminate on) the second source/drain region 827 of the third transistor structure. For example, the third gate insulation layer does not extend to cover any other doping regions in the semiconductor substrate besides covering the third transistor body region 825 at the front surface 113 of the semiconductor substrate, and/or partially or fully covering the first source/drain region 826 of the third transistor structure at the front surface 113 of the semiconductor substrate and/or partially or fully covering the second source/drain region 827 of the third transistor structure at the front surface 113 of the semiconductor substrate.

The semiconductor device 800 may further include a gate 838b of the fourth transistor structure. A transistor channel of the fourth transistor structure controllable by the gate 838b of the fourth transistor structure may be limited to a channel region located between the first source/drain region 831 of the fourth transistor structure 824 and the second source/drain region 832 of the fourth transistor structure.

The gate 838b of the fourth transistor structure may cover the fourth transistor body region 829 at the front surface 113 of the semiconductor substrate, and/or partially or fully cover the first source/drain region 831 of the fourth transistor structure at the front surface 113 of the semiconductor substrate and/or partially or fully cover the second source/drain region 832 of the fourth transistor structure at the front surface 113 of the semiconductor substrate. For example, a first edge of the gate 838b the fourth transistor structure may be located over or on (e.g. may terminate on) the first source/drain region 831 of the fourth transistor structure and a second edge of the gate 838b of the fourth transistor structure may be located on (e.g. may terminate on) the second source/drain region 832 of the fourth transistor structure, for example.

The semiconductor device 800 may further include a fourth gate insulation layer formed between the front surface 113 of the semiconductor substrate 103 and the gate 838b of the fourth transistor structure. The fourth gate insulation layer may be formed directly on or adjacent to the front surface 113 of the semiconductor substrate 103, for example. For example, a first edge of the fourth gate insulation layer may be located over or on (e.g. may terminate on) the first source/drain region 831 of the fourth transistor structure and a second edge of the fourth gate insulation layer may be located on (e.g. may terminate on) the second source/drain region 832 of the fourth transistor structure. For example, the fourth gate insulation layer does not extend to cover any other doping regions in the semiconductor substrate besides covering the fourth transistor body region 829 at the front surface 113 of the semiconductor substrate, and/or partially or fully covering the first source/drain region 831 of the fourth transistor structure at the front surface 113 of the semiconductor substrate and/or partially or fully covering the second source/drain region 832 of the fourth transistor structure at the front surface 113 of the semiconductor substrate.

Additionally or optionally, the gate 165b of the second transistor structure and the gate 838b of the fourth transistor structure may be part of a single gate (e.g. they may be the same gate).

Additionally or optionally, the gate 837b of the third transistor structure may be part of a larger or extended third gate structure and the gate 838b of the fourth transistor structure may be part of a larger or extended fourth gate structure. Additionally or optionally, the second gate structure and the fourth gate structure may be formed or part of the same gate structure. Additionally or optionally, the first gate structure and the third gate structure may be formed or part of the same gate structure.

The transistor channel of the third transistor structure controllable (or induced) by the gate 837b of the third transistor structure may be a (surface) channel of charge carriers of the second conductivity type (e.g. n-type), for example. The transistor channel of the fourth transistor structure controllable by the gate 838b of the fourth transistor structure may be a (surface) channel of charge carriers of the first conductivity type (e.g. p-type), for example. In other words, the transistor channel of the third transistor structure and the transistor channel of the fourth transistor structure may have charge carrier of different or opposite conductivity types. For example, the transistor channel of the third transistor structure and the transistor channel of the first transistor structure may have charge carriers of the same conductivity type, and the transistor channel of the second transistor structure and the transistor channel of the fourth transistor structure may have charge carriers of the same conductivity type.

Additionally or optionally, the fourth gate structure 838b and the second gate structure may be the same single gate structure.

More details and aspects are mentioned in connection with the embodiments described above or below. The embodiments shown in FIG. 8 may comprise one or more optional additional features corresponding to one or more aspects mentioned in connection with the proposed concept or one or more embodiments described above (e.g. FIGS. 1A to 7E) or below (e.g. FIGS. 9 to 17).

Figure 9:
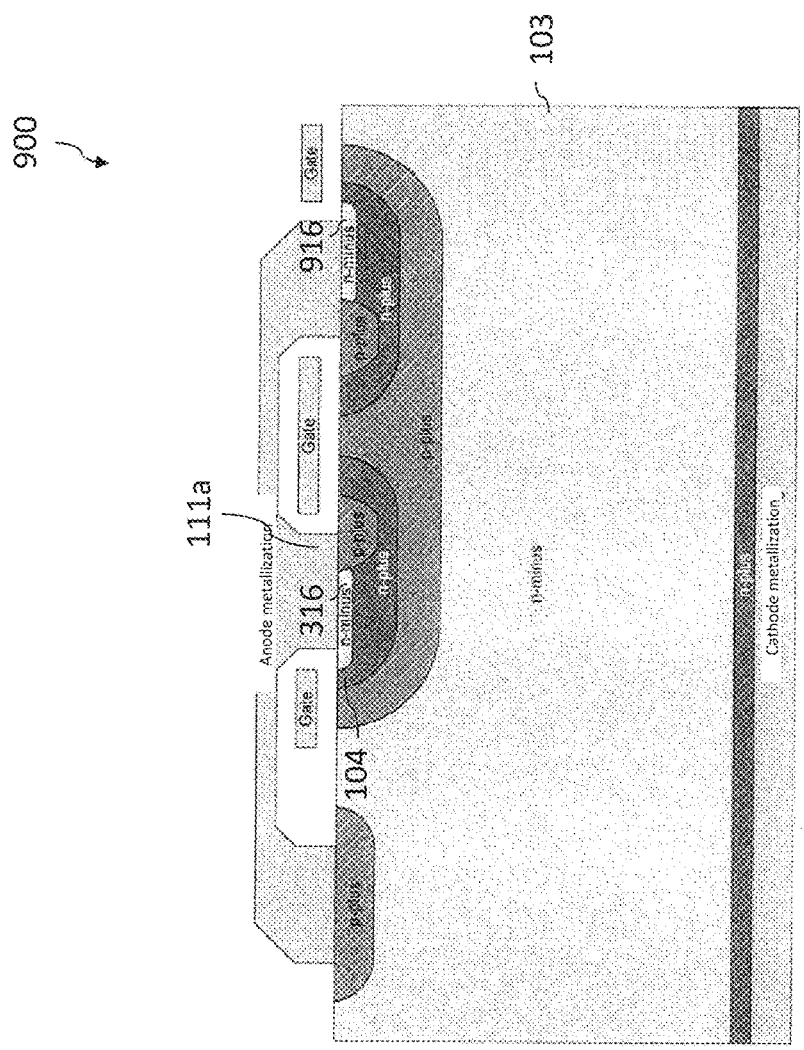
FIG. 9 shows a semiconductor device having four transistor structures and lightly doped regions according to an embodiment.

FIG. 9 shows a schematic illustration of a further semiconductor device 900 according to an embodiment.

The semiconductor device 900 may be similar to the semiconductor devices described with respect to FIGS. 1A to 8. The semiconductor device 900 may include a diode with two anode metallizations, a common p+ region and a Schottky contacted n+ region, for example.

For example, the semiconductor device 900 may include the lightly doped region 316 of the second conductivity type (e.g. n− region) located between the first source/drain region 104 of the first transistor structure and the first partial structure 111a of the first electrode, and a further lightly doped region 916 of the second conductivity type (e.g. n− region) located between the first source/drain region 826 of the third transistor structure and the second partial structure 111b of the first electrode, for example. The further lightly doped region 916 of the second conductivity type may be directly adjacent to the second partial structure 111b of the first electrode structure which may be formed on the further lightly doped region 916, for example. The further lightly doped region 916 of the second conductivity type and the second partial structure 111b of the first electrode may form a Schottky barrier contact, for example.

The lightly doped regions 316, 916 may each have a dopant concentration which lies between $1\times10^{15}$ cm$^{-3}$ to $1\times10^{19}$ cm$^{-3}$, or e.g. between $1\times10^{16}$ to $1\times10^{18}$ cm$^{-3}$, or e.g. between $5\times10^{16}$ to $5\times10^{17}$ cm$^{-3}$, for example.

More details and aspects are mentioned in connection with the embodiments described above or below. The embodiments shown in FIG. 9 may comprise one or more optional additional features corresponding to one or more aspects mentioned in connection with the proposed concept or one or more embodiments described above (e.g. FIGS. 1A to 8) or below (e.g. FIGS. 10 to 17).

Figure 10:
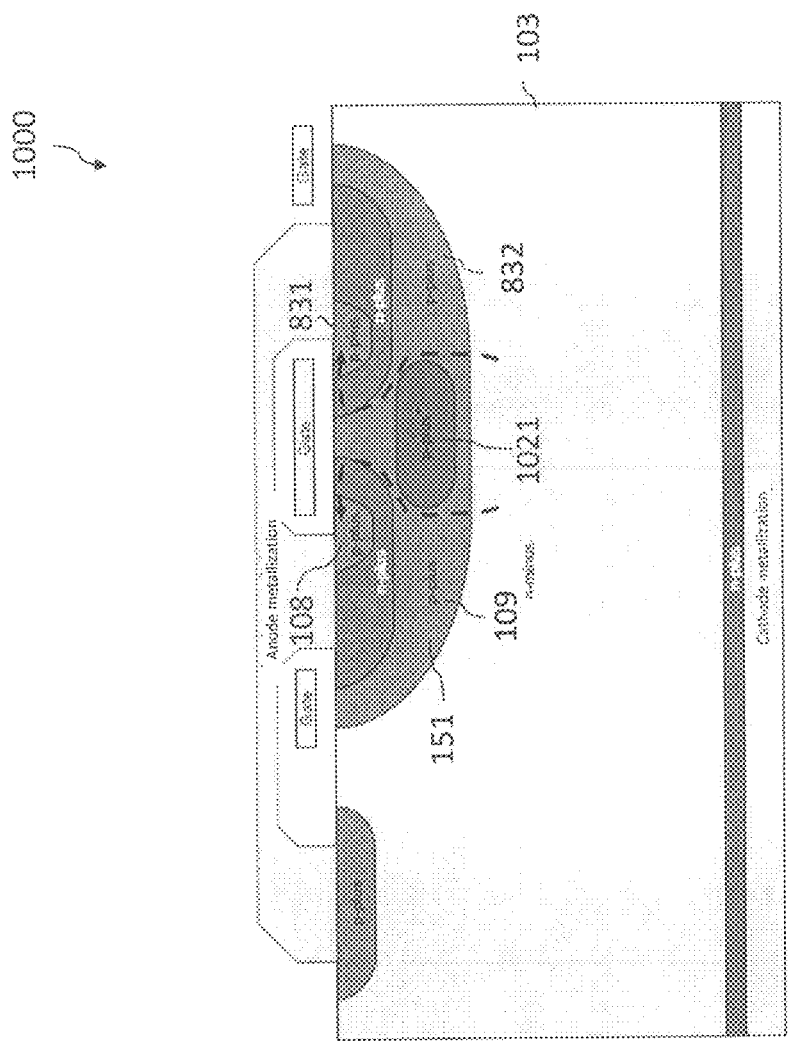
FIG. 10 shows a semiconductor device having four transistor structures and a highly doped region according to an embodiment.

FIG. 10 shows a schematic illustration of a further semiconductor device 1000 according to an embodiment.

The semiconductor device 1000 may be similar to the semiconductor devices described with respect to FIGS. 1A to 9. The semiconductor device 1000 may include a diode with two anode metallizations, a common p+ region and a local highly doped p++ region, for example.

Additionally, optionally or alternatively, the semiconductor device 1000 may include the highly doped region 1021 of the first conductivity type (e.g. a p++ region). The highly doped region 1021 of the first conductivity type may be formed in the first doping region. In an example, the highly doped region 1021 may be formed in a middle region of the first doping region, e.g. below the second (and fourth) gate structure. At least part of the highly doped p++ region 1021 and at least part of the first source/drain region 108 of the second transistor structure may overlap or extend into the same vertical plane of the semiconductor substrate. Another part of the highly doped p++ region 1021 and at least part of the first source/drain region 831 of the fourth transistor structure may overlap or extend into another same vertical plane of the semiconductor substrate.

The highly doped region 1021 may redirect a current path through the second source/drain region 109 of the second transistor structure and the second source/drain region 832 of the fourth transistor structure 828. The redirected current path (dotted arrow) of current due to the highly doped region 1021 through the second transistor structure may be different, e.g. enlarged, in comparison to a current path without the highly doped region. For example, the current path may be redirected around or outside the highly doped region 1021, thereby creating a different or enlarged current path through the second transistor structure and the fourth transistor structure. This may lead to a decrease in current density and thus an improvement in latch-up stability. For example, the electrons may be redirected away from the middle of the p+ region through the n region. The electrons may generate the smallest transverse voltage drop in the n region which leads to a p-n-junction between the upper p+ region and the n+ region in the forwards direction and to the turning on of the thyristor structure.

More details and aspects are mentioned in connection with the embodiments described above or below. The embodiments shown in FIG. 10 may comprise one or more optional additional features corresponding to one or more aspects mentioned in connection with the proposed concept or one or more embodiments described above (e.g. FIGS. 1A to 9) or below (e.g. FIGS. 11 to 17).

Figure 11:
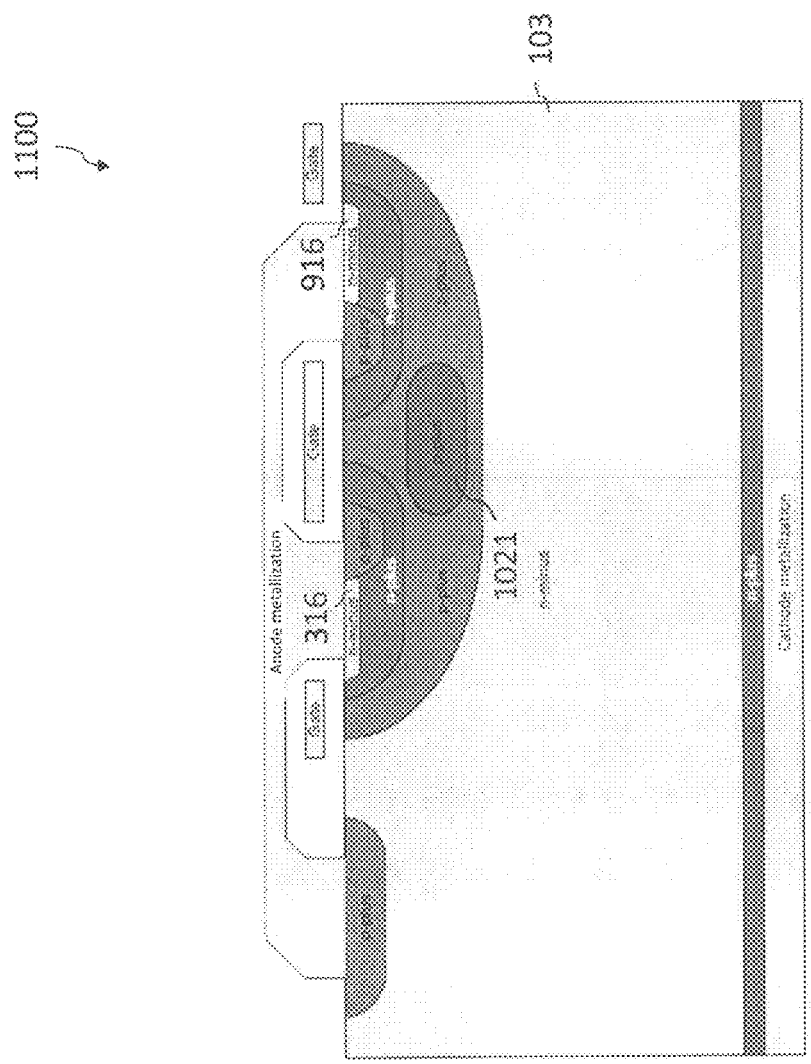
FIG. 11 shows a semiconductor device having four transistor structures, lightly doped regions and a highly doped region according to an embodiment.

FIG. 11 shows a schematic illustration of a further semiconductor device 1100 according to an embodiment.

The semiconductor device 1100 may be similar to the semiconductor devices described with respect to FIGS. 1A to 10. The semiconductor device 1100 may include a diode with two anode metallizations, a common p+ region with a local highly doped p++ region and a Schottky contacted n+ region, for example.

In an example, the semiconductor device 1100 may include the features of the semiconductor device 1000 and further include the lightly doped region 316, 916 described with respect to FIG. 9.

More details and aspects are mentioned in connection with the embodiments described above or below. The embodiments shown in FIG. 11 may comprise one or more optional additional features corresponding to one or more aspects mentioned in connection with the proposed concept or one or more embodiments described above (e.g. FIGS. 1A to 10) or below (e.g. FIGS. 12 to 17).

Figure 12:
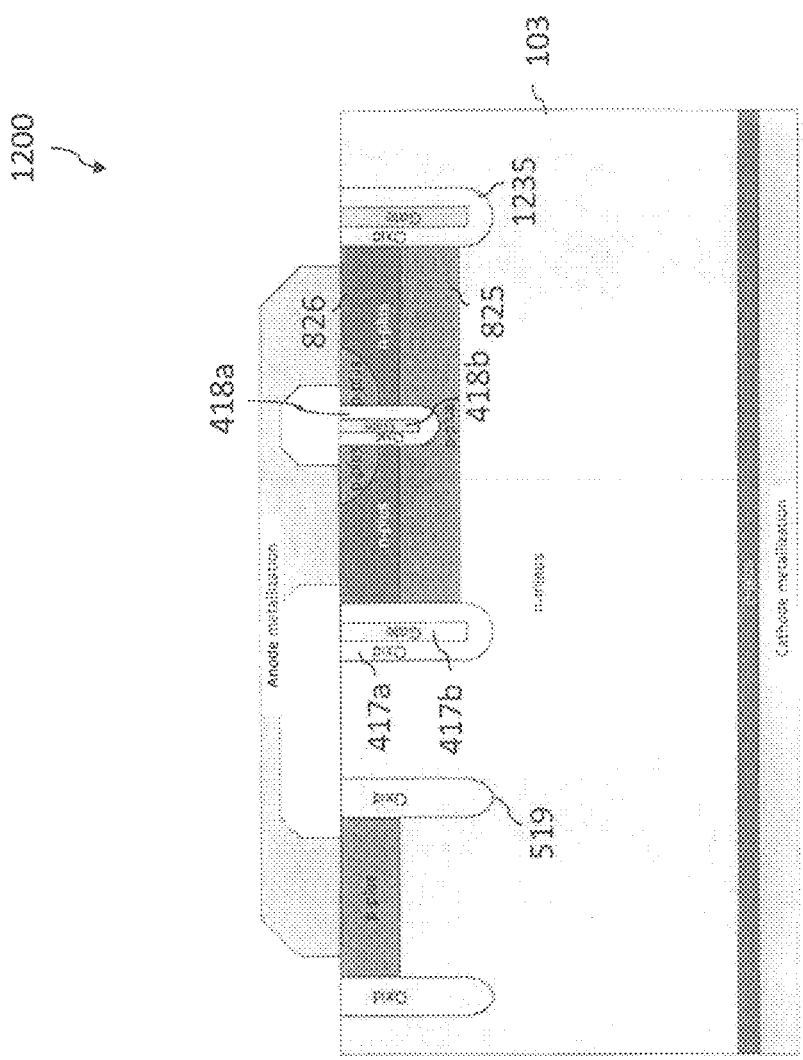
FIG. 12 shows a semiconductor device having four transistor structures, a trench gate structure and an isolation trench structure according to an embodiment.

FIG. 12 shows a schematic illustration of a further semiconductor device 1200 according to an embodiment.

The semiconductor device 1200 may be similar to the semiconductor devices described with respect to FIGS. 1A to 11. The semiconductor device 1200 may include a diode as a trench variation with two anode metallizations.

The semiconductor device 1200 may include the first trench gate structure 417b and the second trench gate structure 418b as described with respect to FIG. 4.

Additionally or optionally, the semiconductor device 1200 may further include a third trench gate structure 1235 extending into the semiconductor substrate 103. The third trench gate structure 1235 may be adjacent to the third transistor body region 825 and/or the first source/drain region 826 of the third transistor structure, for example.

The second trench gate structure 418b may be formed adjacent (e.g. directly adjacent) to the fourth transistor body region 829, the first source/drain region 831 of the fourth transistor structure and the second source/drain region 832 of the fourth transistor structure. For example, the second trench gate structure 418b may contact the first source/drain region 826 of the third transistor structure (e.g. the fourth transistor body region 829) on an opposite side to the third trench gate structure 417, for example. The second trench gate structure 418b may be formed between the second transistor structure 106 and the fourth transistor structure 828 (e.g. adjacent or directly adjacent to the second transistor structure 106 and the fourth transistor structure 828).

In some examples, a trench depth of the second trench gate structure 418b in the semiconductor substrate 103 may be less than a trench depth of the first trench gate structure 417b and the third trench gate structure 1235 in the semiconductor substrate 103. For example, a trench depth of the first trench gate structure 417b and the third trench gate structure may be deeper or greater in the semiconductor substrate than the deepest doping depth of first doping region, and the trench depth of the second trench gate structure 418b may be shallower or less than the deepest doping depth of first doping region.

More details and aspects are mentioned in connection with the embodiments described above or below. The embodiments shown in FIG. 12 may comprise one or more optional additional features corresponding to one or more aspects mentioned in connection with the proposed concept or one or more embodiments described above (e.g. FIGS. 1A to 11) or below (e.g. FIGS. 13 to 17).

Figure 13:
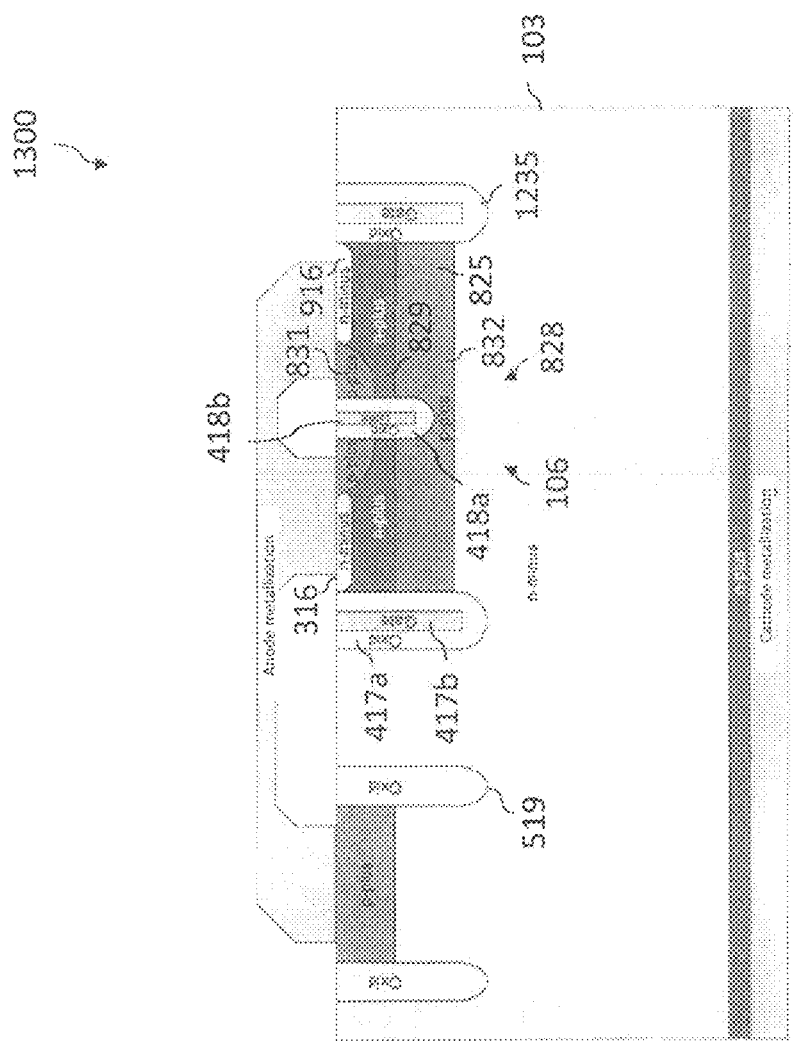
FIG. 13 shows a semiconductor device having four transistor structures, a trench gate structure, an isolation trench structure and lightly doped regions according to an embodiment.

FIG. 13 shows a schematic illustration of a further semiconductor device 1300 according to an embodiment.

The semiconductor device 1300 may be similar to the semiconductor devices described with respect to FIGS. 1A to 12. The semiconductor device 1300 may include a diode as a trench variation with two anode metallizations, a common p+ region and a Schottky contacted n+ region. For example, the semiconductor device 1300 may include the features of the semiconductor device described with respect to FIG. 12 (e.g. the trench gate structures) and may further include the lightly doped regions 316, 916 described with respect to FIG. 9.

More details and aspects are mentioned in connection with the embodiments described above or below. The embodiments shown in FIG. 13 may comprise one or more optional additional features corresponding to one or more aspects mentioned in connection with the proposed concept or one or more embodiments described above (e.g. FIGS. 1A to 12) or below (e.g. FIGS. 14 to 17).

Figure 14:
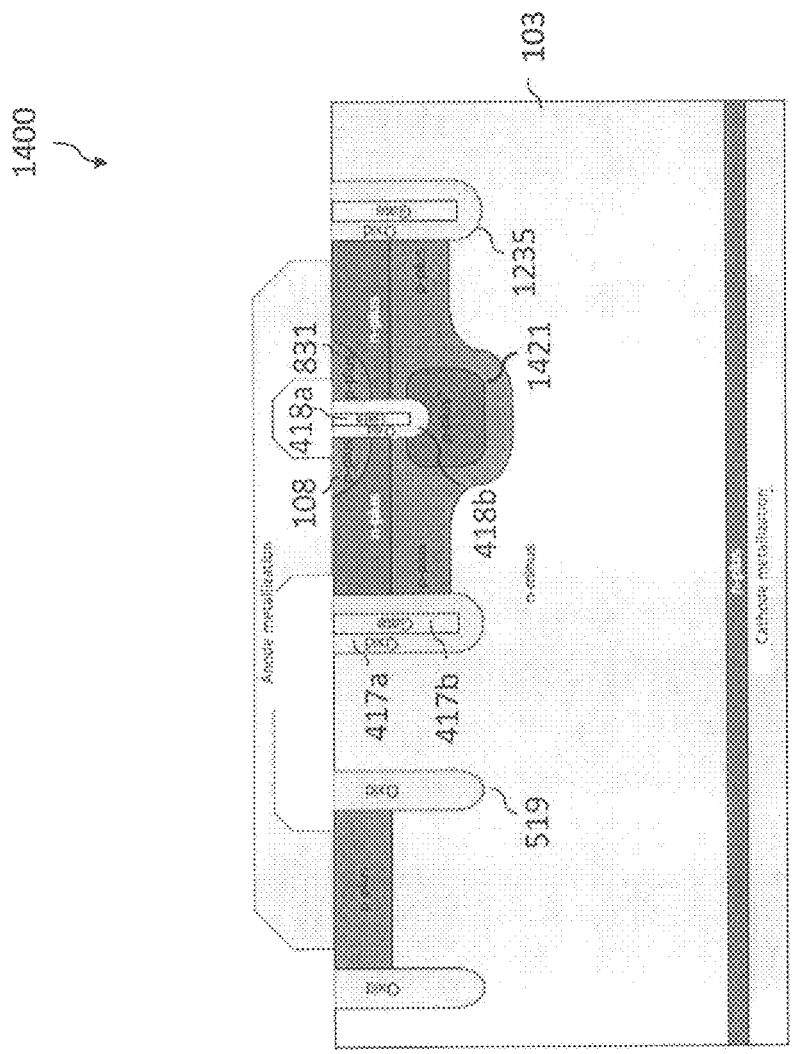
FIG. 14 shows a semiconductor device having four transistor structures, a trench gate structure, an isolation trench structure and a highly doped region according to an embodiment.

FIG. 14 shows a schematic illustration of a further semiconductor device 1400 according to an embodiment. The semiconductor device 1400 may include a diode as a trench variation with two anode metallizations and a local highly doped p++ region 1421, for example. For example, the highly doped p++ region 1421 may extend laterally in the semiconductor substrate (e.g. in a direction horizontally to the main surface of the semiconductor substrate) away from the second trench gate structure 418b. At least part of the highly doped p++ region 1421 may have a larger lateral extension away from the second trench gate structure 418b than the first source/drain region 108 (e.g. p+ region) of the second transistor structure and than the first source/drain region 831 of the fourth transistor structure. For example, at least part of the highly doped p++ region 1021 and at least part of the first source/drain region 108 of the second transistor structure may overlap or extend into the same vertical plane of the semiconductor substrate. Additionally, at least another part of the highly doped p++ region 1421 may have a larger lateral extension away from the second trench gate structure 418b than the first source/drain region 831 of the fourth transistor structure. For example, another part of the highly doped p++ region 1021 and at least part of the first source/drain region 831 of the fourth transistor structure may overlap or extend into another same vertical plane of the semiconductor substrate.

The semiconductor device 1400 may be similar to the semiconductor devices described with respect to FIGS. 1A to 13.

Additionally, optionally or alternatively, the semiconductor device 1400 may include a highly doped region 1421 of the first conductivity type (e.g. a p++ region). The highly doped region 1421 may be similar to the highly doped region 1021. Additionally or alternatively, the highly doped region 1421 of the first conductivity type (e.g. a p++ region) may at least partially surround the second (and fourth) trench gate structure. For example, the highly doped region 1421 may be formed around a portion of the second (and fourth) trench gate structure lying deepest in the semiconductor substrate region.

In other examples, it may be possible for the single second trench gate structure to be replaced by a plurality of trench gate structures with new p-field effect transistor (p-FET) structure, each being at least partially surrounded by a highly doped region (e.g. similar to the highly doped p++ region 1421).

More details and aspects are mentioned in connection with the embodiments described above or below. The embodiments shown in FIG. 14 may comprise one or more optional additional features corresponding to one or more aspects mentioned in connection with the proposed concept or one or more embodiments described above (e.g. FIGS. 1A to 13) or below (e.g. FIGS. 15 to 17).

Figure 15:
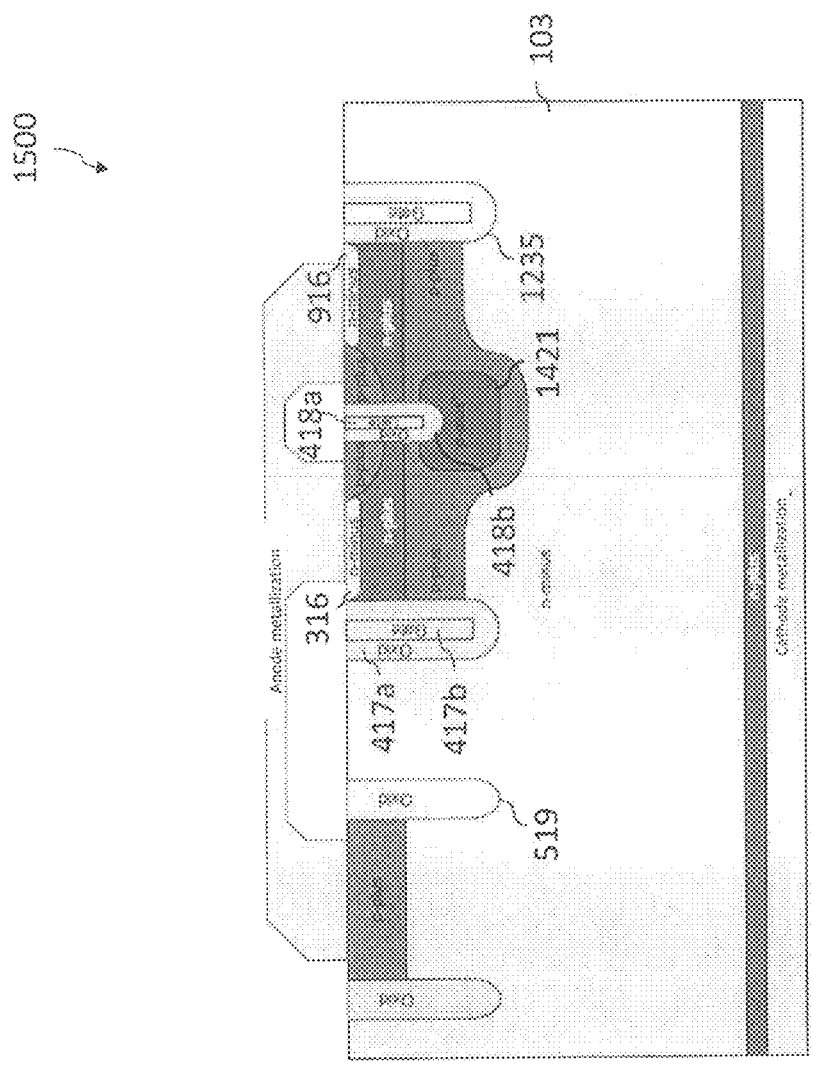
FIG. 15 shows a semiconductor device having four transistor structures, a trench gate structure, an isolation trench structure, lightly doped regions and a highly doped region according to an embodiment.

FIG. 15 shows a schematic illustration of a further semiconductor device 1500 according to an embodiment. The semiconductor device 1500 may include a diode as a trench variation with two anode metallizations, a common p+ region with a local highly doped p++ region, and a Schottky contacted n+ region, for example.

The semiconductor device 1500 may be similar to the semiconductor devices described with respect to FIGS. 1A to 14.

In an example, the semiconductor device 1500 may include the features of the semiconductor device 1400 and further include the lightly doped region 316, 916 described with respect to FIG. 9.

More details and aspects are mentioned in connection with the embodiments described above or below. The embodiments shown in FIG. 15 may comprise one or more optional additional features corresponding to one or more aspects mentioned in connection with the proposed concept or one or more embodiments described above (e.g. FIGS. 1A to 14) or below (e.g. FIGS. 16 to 17).

Figure 16:
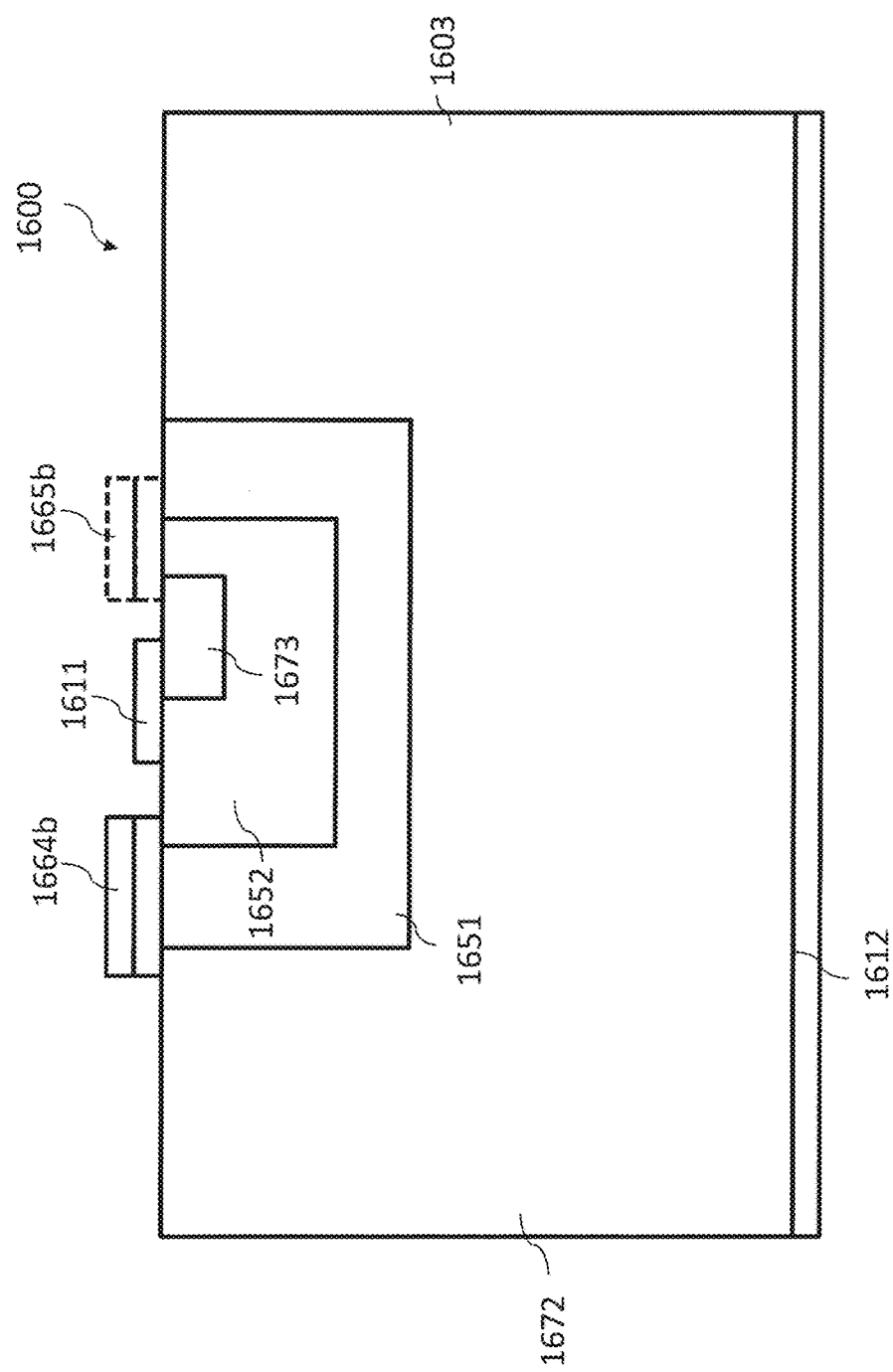
FIG. 16 shows a further semiconductor device according to an embodiment.

FIG. 16 shows a schematic illustration of a further semiconductor device 1600 according to an embodiment.

The semiconductor device 1600 includes a first doping region 1651 of a first conductivity type formed in a fourth doping region 1672 of a semiconductor substrate 1603. The first doping region 1651 forms a first transistor body region of a first transistor structure and a second source/drain region of a second transistor structure. The fourth doping region 1672 forms a second source/drain region of the first transistor structure.

The semiconductor device 1600 includes a second doping region 1652 of a second conductivity type formed adjacent to the first doping region 1651. The second doping region 1652 forms a first source/drain region of the first transistor structure and a second transistor body region of the second transistor structure.

The semiconductor device 1600 includes a third doping region 1673 of a first conductivity type formed adjacent to the second doping region 1652. The third doping region 1673 forms a first source/drain region of the second transistor structure.

The semiconductor device 1600 includes a gate 1664b of the first transistor structure. A transistor channel of the first transistor structure controllable by the gate 1664b of the first transistor structure is limited to a channel region located between the first source/drain region of the first transistor structure and the second source/drain region of the first transistor structure.

The semiconductor device 1600 includes a first electrode structure 1611 in electrical connection with the second doping region 1652 and the third doping region 1673.

The semiconductor device 1600 includes a second electrode region 1612 in electrical connection with the fourth doping region 1672.

Due to the implementation of the first doping region forming the first transistor body region of the first transistor structure and the second source/drain region of the second transistor structure, and the second doping region forming the first source/drain region of the first transistor structure and the second transistor body region of the second transistor structure, a semiconductor device with improved switching speed and higher latch strength may be achieved. Furthermore, the first transistor structure and second transistor structure may be used for tuning or varying a charge carrier concentration, for example. Furthermore, the first transistor structure and the second transistor structure may be more easily produced, for example.

For example, the fourth doping region 1672 may be a bulk or a drift region in the semiconductor substrate. For example, the fourth doping region 1672 may be the drift region having the second conductivity type (e.g. a lightly doped n− region) described with respect to FIG. 1.

For example, the first doping region 1651 may be similar or may be the same as the first doping region described with respect to FIG. 1.

For example, the second doping 1652 may be similar or may be the same as the second doping region described with respect to FIG. 1.

For example, the first transistor structure and the second transistor structure may each be a MOSFET structure.

A first edge of the gate 1664b of the first transistor structure may be located over or on (e.g. formed on) the first source/drain region of the first transistor structure (e.g. over or on the second doping region) and a second edge of the gate of the first transistor structure may be located on a second source/drain region of the first transistor structure (e.g. over or on the fourth doping region), for example.

The semiconductor device 100 may further include a gate 1665b of the second transistor structure. A transistor channel of the second transistor structure controllable by the gate 1665b of the second transistor structure may be limited to a channel region located between the first source/drain region of the second transistor structure and the second source/drain region of the second transistor structure. A first edge of the gate 1665b of the second transistor structure may be located over or on (e.g. formed on) the first source/drain region of the second transistor structure and a second edge of the gate 1665b of the second transistor structure may be located on the second source/drain region of the second transistor structure, for example.

More details and aspects are mentioned in connection with the embodiments described above or below. The embodiments shown in FIG. 16 may comprise one or more optional additional features corresponding to one or more aspects mentioned in connection with the proposed concept or one or more embodiments described above (e.g. FIGS. 1A to 15) or below (e.g. FIG. 17).

Figure 17:
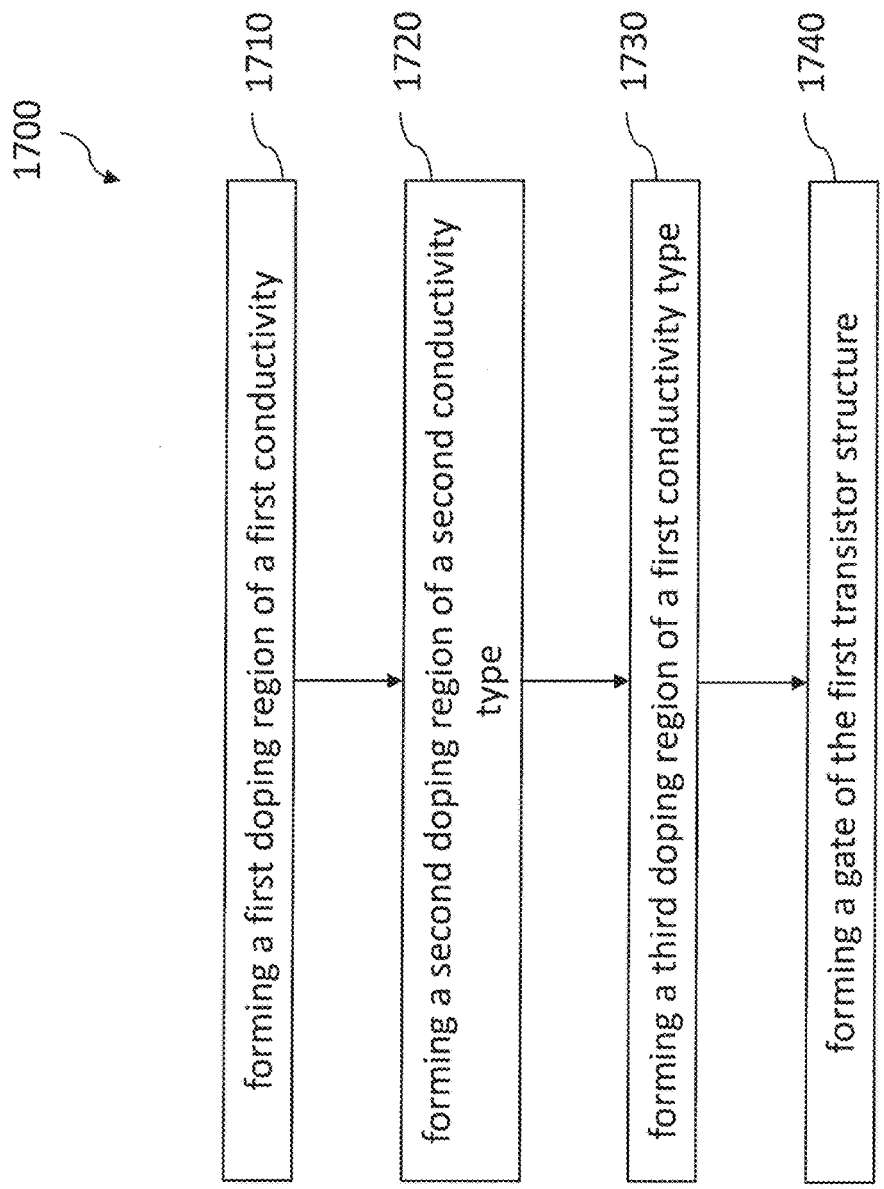
FIG. 17 shows a method for forming a semiconductor device according to an embodiment.

FIG. 17 shows a flow chart of a method 1700 for forming a semiconductor device according to an embodiment.

The method 1700 includes forming 1710 a first doping region of a first conductivity type in a fourth doping region of a semiconductor substrate to form a first transistor body region of a first transistor structure and a second source/drain region of a second transistor structure.

The method further includes forming 1720 a second doping region of a second conductivity type in the first doping region to form a first source/drain region of the first transistor structure and a second transistor body region of the second transistor structure.

The method further includes forming 1730 a third doping region of a first conductivity type in the second doping region to form a first source/drain region of the second transistor structure.

The method further includes forming 1740 a gate of the first transistor structure, wherein a first edge of the gate of the first transistor structure is located adjacent to the second doping region and a second edge of the gate of the first transistor structure is located on the fourth doping region.

Due to the implementation of forming the first transistor structure and the second transistor using three doping regions, a semiconductor device with improved switching speed and higher latch strength may be more easily produced, for example.

In some examples, the method may include forming the first transistor body region between a first source/drain region of the first transistor structure and a second source/drain region of the first transistor structure.

In some examples, the method may include forming the second transistor body region between a first source/drain region of the second transistor structure and a second source/drain region of the second transistor structure.

In some examples, the method may include forming the second source/drain region of the second transistor structure between the second source/drain region of the first transistor structure and the second transistor body region.

In some examples, the method may include forming a first electrode structure in electrical connection with the first source/drain region of the first transistor structure and the first source/drain region of the second transistor structure.

In some examples, the method may include forming a second electrode region 112 in electrical connection with the second source/drain region of the first transistor structure.

In some examples, the method may further include forming a trench gate structure extending into the semiconductor substrate and/or at least two trench gate structures of different depths extending on the semiconductor substrate. The trench gate structures may be formed adjacent to at least one of the first transistor body region and the second transistor body region, for example. For example, the method may include forming a first trench gate structure adjacent to the first transistor body region. The method may further include forming a second trench gate structure adjacent to the second transistor body region.

The method may include forming in a common etching process a first trench gate structure having a first trench width and extending into the semiconductor substrate with a first trench depth, and a second trench gate structure having a second trench width and extending into the semiconductor substrate with a second trench depth. The second trench width may be smaller than the first trench width and the second trench depth may be smaller than the first trench depth, for example.

In other words, the method may include forming the first trench gate structure and the second trench gate structure having different depths extending into the semiconductor substrate in the same process (e.g. in a single process). Furthermore, the method may include forming the first trench gate structure and the second trench gate structure having different lateral dimensions (e.g. different dimensions, or e.g. widths in the horizontal direction). For example, the method may include forming in a single process a first trench gate structure (e.g. 417, 1235) having a first trench width extending into the semiconductor substrate with a first trench depth and a second trench gate structure (e.g. 418) extending into the semiconductor substrate with a second trench depth.

Due to the different lateral dimensions of the structures, forming the first trench gate structure and the second gate structure in the same process may lead to the trench gate structure (e.g. the second trench gate structure) having the smaller lateral dimension (e.g. narrower) extending shallower into the semiconductor substrate than the first trench gate structure.

In some examples, the method may further include forming a highly doped region of the first conductivity type in the first doping region by implanting dopant atoms through the trench gate structure (e.g. by implanting the dopant atoms through the narrower (second) trench gate structure and extending shallower into the semiconductor substrate). A highly doped region (e.g. the highly doped region 1441) may thus be formed adjacent to the (second) trench gate structure or around or surrounding at least part of the (second) trench gate structure.

More details and aspects are mentioned in connection with the embodiments described above or below. The embodiments shown in FIG. 17 may comprise one or more optional additional features corresponding to one or more aspects mentioned in connection with the proposed concept or one or more embodiments described above (e.g. FIGS. 1A to 16) or below.

Various examples relate to a diode with controllable anode efficiency using a gate. Various examples described herein may relate to a diode, which may operate in two voltage switching states and also makes possible a large spreading of the charge carrier concentration between the high speed and the low saturation state and at the same time higher latch stability.

Various examples relate to a separation of current paths for electron current and hole current in a switchable structure. Thus, conflicting requirements of the doping area such as latch stability and larger spreading may be handled. In various examples, within the semiconductor structure this may be achieved through the contacting of an n-emitter region parallel to a p-emitter region.

In various examples, the gate electrode adjacent to the n-emitter region projects over the floating p+ region, for example.

In various examples, the gate electrode adjacent to the p-emitter region may be shorter and does not project over the floating p+ region, for example. Thus, a formation of a p-emitter side n-channel in the p+ region is avoided, so that the p-emitter region does not need to have maximum latch stability. The achieved freedom level may be used to increase the spread. On the other hand, a spatially targeted inhomogeneous doping concentration is used for the floating p+ region. Through the resulting different high emitter efficiency of the p+ region, the charge carrier concentration may be positively influenced in the "low saturation" state without negative effects on the "high speed" state, for example.

In various examples, the diode as a trench variation with two anode metallizations offers by the shorter trench, the possibility of a higher doping concentration in the p+ region, as for the lateral case. The used implantation energies may be clearly lower when the etched trenches are used for implantation, for example. Diodes optimized for low reverse recovery charges may have larger forward voltages, for example.

Aspects and features (e.g. the semiconductor device, the first transistor structure, the second transistor structure, the first transistor body region, the second transistor body region, the first source/drain region of the first transistor structure, the second source/drain region of the first transistor structure, the first source/drain region of the second transistor structure, the second source/drain region of the second transistor structure, the semiconductor substrate, the first electrode structure, the second electrode region, the front surface, the back surface, the gate of the first transistor structure, the gate of the second transistor structure, the gate of the third transistor structure, the gate of the fourth transistor structure, the gate insulation layer of the first transistor structure, the gate insulation layer of the second transistor structure, the gate insulation layer of the third transistor structure, the gate insulation layer of the fourth transistor structure, the first gate structure, the second gate structure, the third gate structure, the fourth gate structure, the trench gate structures, the trench gate insulation regions, the diode structure, the first doping region, the diode doping region, the third doping region, the fourth doping region, the highly doped regions of the first conductivity type, the lightly doped regions of the second conductivity type, the drift region, and the emitter region) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device comprising:
   a first transistor structure comprising a first transistor body region of a first conductivity type located within a semiconductor substrate, wherein at least a part of the first transistor body region is located between a first source/drain region of the first transistor structure and a second source/drain region of the first transistor structure;
   a second transistor structure comprising a second transistor body region of a second conductivity type located within the semiconductor substrate, wherein at least a part of the second transistor body region is located between a first source/drain region of the second transistor structure and a second source/drain region of the second transistor structure, wherein at least a part of the second source/drain region of the second transistor structure is located between the second source/drain region of the first transistor structure and the second transistor body region, wherein the first transistor body region and the second source/drain region of the second transistor structure are implemented as a common doping region of the first conductivity type, and wherein the second transistor body region and the first source/drain region of the first transistor structure are implemented as a common doping region of the second conductivity type;
   a first trench gate structure and a second trench gate structure extending into the semiconductor substrate, the first trench gate structure comprising a gate of the first transistor structure and the second trench gate structure comprising a gate of the second transistor structure, wherein the first trench gate structure is adjacent to the first transistor body region and the second trench gate structure is adjacent to the second transistor body region;
   a first electrode structure in electrical connection with the first source/drain region of the first transistor structure and the first source/drain region of the second transistor structure; and
   a second electrode region in electrical connection with the second source/drain region of the first transistor structure.

2. The semiconductor device according to claim 1, wherein at least part of the first electrode structure is formed in a trench structure formed within at least one of the first source/drain region of the first transistor structure and the first source/drain region of the second transistor structure.

3. The semiconductor device according to claim 1, further comprising a lightly doped region of the second conductivity type located between the first source/drain region of the first transistor structure and the first electrode structure.

4. The semiconductor device according to claim 1, wherein a trench depth of the second trench gate structure in the semiconductor substrate is less than a trench depth of the first trench gate structure in the semiconductor substrate.

5. The semiconductor device according to claim 1, further comprising a highly doped region of the first conductivity type adjoining the second trench gate structure.

6. The semiconductor device according to claim 1, further comprising a highly doped region of the first conductivity type formed in a doping region comprising the second source/drain region of the second transistor structure.

7. The semiconductor device according to claim 6, wherein the highly doped region of the first conductivity type redirects a current path through the doping region comprising the second source/drain region of the second transistor structure.

8. The semiconductor device according to claim 1, further comprising a diode structure comprising a first diode doping region of the first conductivity type and a second diode doping region of the second conductivity type within the semiconductor substrate, wherein the first diode doping region is electrically connected to the first electrode structure and the second diode doping region is electrically connected to the second electrode region.

9. The semiconductor device according to claim 8, wherein the second diode doping region and the second source/drain region of the first transistor structure are implemented by a common semiconductor doping region of the second conductivity type.

10. The semiconductor device according to claim 1, further comprising a diode doping region in electrical connection with the first electrode structure.

11. The semiconductor device according to claim 10, further comprising an isolation trench structure located around the diode doping region.

12. The semiconductor device according to claim 11, wherein the isolation trench structure extends deeper into the semiconductor substrate than the diode doping region.

13. The semiconductor device according to claim 11, wherein the isolation trench structure extends into a drift region.

* * * * *